United States Patent [19]

Ooshima et al.

[11] Patent Number: 5,321,354
[45] Date of Patent: Jun. 14, 1994

[54] METHOD FOR INSPECTING SEMICONDUCTOR DEVICES

[75] Inventors: Yoshimasa Ooshima; Toshio Shimizu; Katsuya Iida; Fumiaki Kumazawa, all of Suwa, Japan

[73] Assignee: Seiko Epson Corporation, Tokyo, Japan

[21] Appl. No.: 842,121
[22] PCT Filed: Jul. 9, 1991
[86] PCT No.: PCT/JP91/00971
§ 371 Date: May 18, 1992
§ 102(e) Date: May 18, 1992
[87] PCT Pub. No.: WO92/01942
PCT Pub. Date: Feb. 6, 1992

[30] Foreign Application Priority Data

Jul. 23, 1990 [JP] Japan .................. 2-194241

[51] Int. Cl.$^5$ .................................. G01R 31/28
[52] U.S. Cl. .................. 324/158 R; 371/25.1
[58] Field of Search ............ 324/158 R, 73.1; 371/21.1, 21.4, 25.1, 27

[56] References Cited

U.S. PATENT DOCUMENTS

| | | | |
|---|---|---|---|
| 4,207,611 | 6/1980 | Gordon | 324/73.1 |
| 4,631,724 | 12/1986 | Shimizu | 371/27 |
| 4,637,020 | 1/1987 | Schinabeck | 371/25.1 |
| 4,710,704 | 12/1987 | Ando | 371/25.1 |
| 4,820,974 | 4/1989 | Katsura et al. | 371/21.4 |
| 4,985,672 | 1/1991 | Hashimoto et al. | 324/73.1 |
| 5,057,774 | 10/1991 | Verhelst et al. | 324/158 R |
| 5,097,206 | 3/1992 | Perner | 324/158 R |
| 5,132,615 | 7/1992 | Person | 324/158 R |

FOREIGN PATENT DOCUMENTS 386804 9/1990 European Pat. Off. .
55-166057 12/1980 Japan .
57-169684 10/1982 Japan .
3-78672 4/1991 Japan .

OTHER PUBLICATIONS

IEEE International Conference On Computer-aided Design, Iccad-88, Nov. 7-10, 1988, California, USA, pp. 340-343; "Built-In Current Testing-Feasibility Study" by Wojciech Maly and Phil Nigh.
Elektronik, vol. 37, No. 12, Jun. 10, 1988, pp. 135-138; "Effizienter ASIC-Prototypentest" by Gordon Judd, p. 137, col. 2, line 22-p. 138, col. 2, 1 ine 25.
IEEE International Conference On Computer-Aided Design, ICCAD-90, Nov. 11-15, 1990, California, USA, pp. 280-283; "Quietest: A Quiescent Current Testing Methodology for Detecting Leakage Faults" by Wei-wei Mao, et al.
IEEE Transactions on Instrumentation and Measurement, vol. 38, No. 3, Jun. 1989, New York, USA, pp. 773-778; "Fault Detection in CMOS Circuits by Consumption Measurement" by Mireille Jacomino, et al.

Primary Examiner—Ernest F. Karlsen
Attorney, Agent, or Firm—Harold T. Tsiang

[57] ABSTRACT

A method for detecting the quality of a semiconductor device using a static current that flows in a state wherein internal elements are fixed, the semiconductor device has internal elements, such as MISFETs and complementary MISFETs in particular. By using a pattern group that controls the state of nodes of the internal elements or ON/OFF and other states of MISFETs that comprise the internal elements, as a test pattern group used for this inspection, faults involving long range reliability in addition to degenerate faults and those faults detected using conventional fault simulation may be detected. In the inspection method based on static current, observability of faults at output terminals need not be taken into consideration, so that the number of patterns in the test pattern group used for inspection may be less and may be easily created.

23 Claims, 17 Drawing Sheets

| EVENT | NODE STATE (NODE NUMBERS & STATES) |
|---|---|
| ⋮ | |
| 101 | 8 1 9 0 13 0 14 1 15 0 15 0 17 0 21 2 24 0 25 0 271 |
| 102 | 5 1 9 1 15 1 24 1 |
| 103 | 3 1 7 0 10 1 11 0 12 0 16 1 20 1 22 0 23 0 26 1 |
| 104 | 3 0 5 0 6 0 9 0 15 0 16 0 18 0 24 0 28 0 31 0 32 0 |
| 105 | 3 1 6 1 10 0 11 1 12 1 16 1 20 0 22 1 23 1 26 0 28 |
| 106 | 3 0 4 1 6 2 7 1 8 0 16 0 17 1 27 0 29 1 31 0 32 0 |
| 107 | 2 1 9 1 18 1 25 1 30 1 |
| 108 | 3 1 7 0 10 1 11 0 12 0 16 1 20 1 22 0 23 0 26 1 |
| 109 | 3 0 16 0 28 0 |
| 110 | 1 0 3 1 12 1 13 1 14 0 16 1 21 1 |
| 111 | 3 0 7 1 16 0 |
| ⋮ | |

↑ ↑ STATE OF CHANGED NODE
NODE NUMBER

IQC FILE OUTPUT

FIG.–15

| EVENT | NO. OF NODES TO BE "0" STATE | NO. OF NODES TO BE "1" STATE |
|---|---|---|
| 1 | 4 | 13 |
| 2 | 8 | 9 |
| 3 | 13 | 12 |
| 4 | 7 | 23 |
| 5 | 14 | 16 |
| 6 | 11 | 18 |
| 7 | 16 | 13 |
| 8 | 16 | 13 |
| 9 | 13 | 16 |
| 10 | 16 | 13 |
| 11 | 15 | 10 |
| ⋮ | ⋮ | ⋮ |

STF FILE OUTPUT

FIG.–16

| NO. OF EVENTS | NODE NO. | EVENT NO. |
|---|---|---|
| 2 | 1 | 10 11 |
| 7 | 2 | 0 1 2 3 4 5 6 |
| 8 | 3 | 0 1 2 4 6 7 9 11 |
| 6 | 4 | 0 1 2 3 4 5 |
| 10 | 5 | 0 1 4 5 6 7 8 9 10 11 |
| 1 | 6 | 4 |
| 6 | 7 | 3 4 5 8 9 10 |
| 6 | 8 | 6 7 8 9 10 11 |
| 4 | 9 | 1 4 5 6 |
| 3 | 10 | 5 6 7 |
| 6 | 11 | 3 4 8 9 10 11 |
| 4 | 12 | 3 4 8 9 |
| 9 | 13 | 1 2 3 4 5 6 7 8 9 |
| 2 | 14 | 10 11 |
| 9 | 15 | 1 4 5 6 7 8 9 10 11 |
| 7 | 16 | 1 2 4 6 7 9 11 |
| 5 | 17 | 1 2 3 4 5 |
| 3 | 18 | 4 5 6 |
| ⋮ | ⋮ | ⋮ |

IQL FILE OUTPUT

FIG.−17

| NO. OF EVENTS | NODE NO. | EVENT NO. |
|---|---|---|
| 10 | 1 | 0 1 2 3 4 5 6 7 8 9 |
| 5 | 2 | 7 8 9 10 11 |
| 4 | 3 | 3 5 8 10 |
| 6 | 4 | 6 7 8 9 10 11 |
| 2 | 5 | 2 3 |
| 1 | 6 | 5 |
| 3 | 7 | 6 7 11 |
| 5 | 8 | 1 2 3 4 5 |
| 7 | 9 | 2 3 7 8 9 10 11 |
| 6 | 10 | 3 4 8 9 10 11 |
| 3 | 11 | 5 6 7 |
| 5 | 12 | 5 6 7 10 11 |
| 2 | 13 | 10 11 |
| 9 | 14 | 1 2 3 4 5 6 7 8 9 |
| 2 | 15 | 2 3 |
| 4 | 16 | 3 5 8 10 |
| 6 | 17 | 6 7 8 9 10 11 |
| 5 | 18 | 7 8 9 10 11 |
| ⋮ | ⋮ | ⋮ |

IQH FILE OUTPUT

FIG.−18

| NO. OF EVENTS | NODE NO. | EVENT NO. |
|---|---|---|
| 1 | 6 | 4 |
| 2 | 1 | 10 11 |
| 2 | 14 | 10 11 |
| 3 | 10 | 5 6 7 |
| 3 | 18 | 4 5 6 |
| 3 | 26 | 5 6 7 |
| 3 | 20 | 5 6 7 |
| 4 | 12 | 3 4 8 9 |
| 4 | 28 | 4 9 10 11 |
| 4 | 9 | 1 4 5 6 |
| 4 | 23 | 3 4 8 9 |
| 5 | 17 | 1 2 3 4 5 |
| 5 | 29 | 1 2 3 4 5 |
| 6 | 25 | 1 2 3 4 5 6 |
| 6 | 4 | 0 1 2 3 4 5 |
| 6 | 22 | 3 4 8 9 10 11 |
| 6 | 7 | 3 4 5 8 9 10 |
| 6 | 27 | 6 7 8 9 10 11 |
| 6 | 11 | 3 4 8 9 10 11 |
| 6 | 8 | 6 7 8 9 10 11 |
| 7 | 32 | 4 6 7 8 9 10 11 |
| 7 | 30 | 0 1 2 3 4 5 6 |
| 7 | 31 | 4 6 7 8 9 10 11 |
| 7 | 16 | 1 2 4 6 7 9 11 |
| 7 | 2 | 0 1 2 3 4 5 6 |
| 8 | 3 | 0 1 2 4 6 7 9 11 |
| 9 | 13 | 1 2 3 4 5 6 7 8 9 |
| 9 | 24 | 1 4 5 6 7 8 9 10 11 |
| 9 | 15 | 1 4 5 6 7 8 9 10 11 |
| 10 | 5 | 0 1 4 5 6 7 8 9 10 11 |
| ⋮ | ⋮ | ⋮ |

IQLOW FILE OUTPUT

FIG.—19

| NO. OF EVENTS | NODE NO. | EVENT NO. |
|---|---|---|
| 1 | 6 | 5 |
| 1 | 32 | 5 |
| 1 | 31 | 5 |
| 2 | 13 | 10 11 |
| 2 | 21 | 10 11 |
| 2 | 15 | 2 3 |
| 2 | 24 | 2 3 |
| 2 | 5 | 2 3 |
| 3 | 11 | 5 6 7 |
| 3 | 7 | 6 7 11 |
| 3 | 23 | 5 6 7 |
| 3 | 22 | 5 6 7 |
| 4 | 28 | 5 6 7 8 |
| 4 | 16 | 3 5 8 10 |
| 4 | 3 | 3 5 8 10 |
| 5 | 25 | 7 8 9 10 11 |
| 5 | 8 | 1 2 3 4 5 |
| 5 | 27 | 1 2 3 4 5 |
| 5 | 30 | 7 8 9 10 11 |
| 5 | 2 | 7 8 9 10 11 |
| 5 | 12 | 5 6 7 10 11 |
| 5 | 18 | 7 8 9 10 11 |
| 6 | 26 | 3 4 8 9 10 11 |
| 6 | 29 | 6 7 8 9 10 11 |
| ⋮ | ⋮ | ⋮ |

IQHIGH FILE OUTPUT

FIG.—20

| PRIVITIVE TYPE | NODE STATE | SPECIFIC STATE |
|---|---|---|
| NA2 | 11 | A |
| NA2 | 10 | B |
| NA2 | 01 | C |
| NA3 | 111 | A |
| NA3 | 110 | B |
| NA3 | 101 | C |
| NA3 | 011 | D |
| NA4 | 1111 | A |
| NA4 | 1110 | B |
| NA4 | 1101 | C |
| NA4 | 1011 | D |
| NA4 | 0111 | E |
| NO2 | 00 | A |
| NO2 | 01 | B |
| NO2 | 10 | C |

INTERNAL STATE INFORMATION LIBRARY OUTPUT

FIG.-24

| EVENT NO. | NO. OF SPECIFIC STATES | SPECIFIC STATE FOR EACH PRIMITIVE |
|---|---|---|
| ... | ... | ... |
| 1015 | 0699 | BBBC DB A       DCCCCB A C E  ADDAD BCC B AB B DD B |
| 1016 | 0694 | BBBC DA A       DCCCCB A C E  ADDAD BCC B ABAB D DDA |
| 1017 | 0700 | BBBC DB A       DCCCCB A C E  ADDAD BCC B ABAB D DDA |
| 1018 | 0707 | BBBC DA AAADD   DCCCCB A C E  ADDAD BCC B AB  DD  A |
| 1019 | 0713 | BBBC DB AAADD   DCCCCB A C E  ADDAD BCC B AB   D DA |
| 1020 | 0700 | BBBC DA AAADD   DCCCCB A C E  ADDAD BCC B ABA  D DA |
| 1021 | 0702 | BBBC DB AAADD   DCCCCB A C E  ADDAD BCC B ABA  DD D |
| 1022 | 0708 | BBBC DA AB  D   DCCCCB A C E  ADDAD BCC B AB B DD DA |
| 1023 | 0714 | BBBC DB  B  D   DCCCCB A C E  ADDAD BCC B ABAB D  A |
| 1024 | 0697 | BBBC D  CB D    DCCCCB A C E  ADDAD CC  B AB  D  A |
| 1025 | 0702 | BBBC DC  C  A   DCCCCB A C E  ADDAD CC  B AB   D  A |
| 1026 | 0693 | BBBC DC  C  A  DD CCCCCB A C E  ADDAD CC  B ABA  D BA |
| 1027 | 0692 | BBBC DC  C  A  D  CCCCCB A C E  ADDAD CC  B ABAB D BA |
| 1028 | 0687 | BBBC DC  C  A  DD CCCCCB A C E  ADDAD CC  B AB  DD B |
| 1029 | 0691 | BBBC DC  C  A  DD CCCCCB A C E  ADDAD CC  B AB  DD B |
| 1030 | 0698 | BBBC DC  C      D  CCCCCB A C E  ADDAD CC  B ABA  DD DA |
| 1031 | 0701 | BBBC DA  A      DD CCCCCB A C E  ADDAD CC  B ABAB DD DA |
| 1032 | 0704 | BBBC D   AADD   D  CCCCCB A C E  ADDAD BCC B AB B DD B |
| 1033 | 0709 | BBBC D   ADDD      CCCCCB A C E  ADDAD BCC B ABAB D DDA |
| 1034 | 0691 | BBBC D   ADDD      CCCCCB A C E  ADDAD CC  B AB  DD  |
| 1035 | 0692 | BBBC D   CAADD ADDAAD CCCCCB A C E  ADDAD CC  B AB  DD  |
| ... | ... | ... |

EVST FILE OUTPUT

| EVENT NO. | NO. OF SPECIFIC STATES | SPECIFIC STATE FOR EACH PRIMITIVE |
|---|---|---|
| . . | . . | . . |
| 0912 | 0731 | DBBBC DA AB D DADDAA      DCC CB   A   C E B   A   ADDAD BCC B ABABA D D A |
| 0297 | 0362 |        C  C DC A     BBAD  C        B   F C A          B          D D B |
| 1175 | 0234 |        BA    B      D DC            C                 CC A |
| 1322 | 0148 |        B A D DA   E                 C                  C  B |
| 0373 | 0111 |        C    DA       A   C   B      A                  C  A |
| 1885 | 0087 |                                                        FA      AD  A |
| . . | . . | . . . . |

FIG.-25

MEV FILE OUTPUT

METHOD FOR INSPECTING SEMICONDUCTOR DEVICES

BACKGROUND OF THE INVENTION

1. Field of the Invention

The present invention relates to a method and system for inspecting the quality of a semiconductor device which has circuits containing MISFETs and functional cells. More particularly, the present invention is concerned with inspecting semiconductor device quality based on measurement of static current in the semiconductor device, and a method for producing a semiconductor device inspected by the method of the present invention.

2. Description of the Related Art

Lately, as semiconductor devices have become highly integrated and have a high degree of functionality, it has become very difficult to carry out tests for determining the quality of the semiconductor devices. For example, while defects on circuits may be relatively easily detected on a printed board in which the circuits are highly integrated since it is possible to carry out a test using endpoints such as individual ICs and resistors, in addition to I/O terminals, to confirm function, the inside of a semiconductor device like an LSI (large scale integration) circuit, which is highly integrated, is wholly a "black box" and the internal operation of an LSI circuit can only be observed through external terminals. However, the function or operation of such circuits still need to be confirmed and it needs to be determined whether they are good or bad, since equipment having a defective LSI circuit will not perform in accordance with its intended design function. Accordingly, it has become an important issue not only for users but also for circuit designers and semiconductor device producers, as to how to accurately inspect a single LSI circuit.

In order to confirm that such a semiconductor device is accurately designed and is produced without defects, the circuit designer creates function test patterns using logical simulations. The function test patterns do not always have a high fault-detection rate, so the designer has to devise various test circuit structures or add test patterns. It is possible to create test patterns that can inspect all combinations of inputs and all internal states to confirm the function of an LSI circuit. However, given a device with n inputs and m internal registers, $2^{n+m}$ test patterns are required to inspect the device based on the aforementioned method. Therefore, it requires an enormous number of test patterns even for a device only having 10 inputs and 10 internal registers.

Experience has shown that the cost of creating test patterns having a high fault-detection rate is proportional to from the square to the cube of the number of gates. Furthermore, it is not easy to create test patterns having a high fault-detection rate for a highly functional and large integrated scale type of semiconductor device. To this end, several easy-to-test designs in which testing is taken into consideration during the designing stage have been proposed, and semiconductor devices are being designed based on these easy-to-test designs.

Problems in facilitating the tests are roughly divided into two categories: controllability and observability. Controllability relates to how gates within the circuit can be driven during the inspection process, where it is desirable to be able to turn all of the gates ON/OFF in order to detect an abnormality in the circuit. Observability relates to how to observe the abnormality in the operation of the gates. That is, it means that a fault in the gates cannot be detected as a fault unless it is transmitted to an observation point. In order to accurately carry out inspection of the semiconductor device, test patterns and circuit design that satisfy both controllability and observability are necessary.

One of the methods adopted for highly integrated semiconductor devices among such settings for facilitating testing is a scan-pass method as shown in FIG. 26. This method allows division of circuits structured within a semiconductor device into several combinational circuits C1, C2, and C3 by separating them from normal connections during inspection. The combination circuits C1, C2, and C3 are then driven and inspected one by one. Although this method requires many flip-flops $F_l$ to $F_m$ for dividing and inspecting the circuits, the controllability and observability of the test patterns may be enhanced since the control and observation points are increased in response to the added number of flip-flops, $F_l$ to $F_m$, in addition to j inputs $I_l$ to $I_j$ and n outputs $O_l$ to $O_n$. Furthermore, a test pattern group used for inspecting the semiconductor device for which such a design technique has been adopted, is a set of patterns, that allow observation of a fault, selected from a test pattern group automatically created and selected based on an algorithm D and a random number method through fault simulations, to enhance the fault detection rate.

To increase the number of observation points, a cross-check method that connects the outputs of all gates to terminals for testing has also been proposed. The use of this method allows an improved fault-detection rate, however, it has the disadvantage that the number of gates, and the area of the semiconductor device, are increased due to additional circuits like flip-flops and terminals. While miniaturization of semiconductor devices is being promoted by highly integrating and providing a high degree of functionality to semiconductor devices, the circuits necessary for inspecting those devices are being increased and the area occupied by the additional circuits is also being increased within the device.

There is also another disadvantage in that the production cost of the semiconductor device is increased by installing such additional circuits. There is still another disadvantage in that operation of the device cannot be confirmed by an inspection carried out under a state different from a state of the circuit actually used, since the inspection is carried out using additional circuits.

Accordingly, in light of the aforementioned disadvantages, an object of the present invention is to realize a method and a system that allow effective inspection of a fault on circuits formed on the semiconductor device in a relatively short time. It is a further object of the present invention to suppress the increase in area of the semiconductor device due to additional circuits and to allow inspection of the semiconductor device in real operation.

SUMMARY OF THE INVENTION

According to the present invention, in order to realize the aforementioned inspection, a fault in a semiconductor device is detected by detecting static current that flows in a power circuit of the semiconductor device. The static current is a power source current that flows in a state wherein MISFETs that comprise internal elements of the semiconductor device are fixed to $V_{dd}$ or $V_{ss}$. The static current is normally a very weak current that flows in a state in which a circuit using MISFETs, especially complementary MISFETs, is fixed. Therefore, an excessive leak current caused in a production process, a leak current generated accompanying a short-circuit or an open-circuit, and a leak current that causes a lack of long range reliability may each be measured by measuring the static current. Accordingly, as in conventional inspection, the static current is used as a supplementary method for functional inspections using the aforementioned test pattern group and only test patterns that assume a certain state are measured.

The present invention observes that the static current flows even in a degenerate fault or an off-leak fault of the internal elements that comprise the semiconductor device, and uses the static current for detecting a fault in a functional inspection of the semiconductor device using the test pattern group.

That is, when there is a degenerate fault in which connecting points of the internal elements that compose the circuit are fixed to 0 or 1, or there is an operational failure in the MISFETs themselves which comprise the internal elements, the static current may be generated by keeping the state of the internal elements constant. By turning the state of the internal elements into a state in which the static current flows due to a fault, i.e. into a state in which the fault can be observed by the static current, the static current flows directly between $V_{dd}$ and $V_{ss}$ or through an intermediary of a very small number of MISFETs in the device having the fault. A detail description will be made later.

Accordingly, the fault can be observed very easily by detecting the static current. This inspection method has very good observability since the fault need not be observed through terminals connected to the outside through other logical gates. Moreover, this method requires no test pattern in which how to transmit the fault is taken into account in order to observe the fault to be created as in the conventional inspection methods. Therefore, only the controllability of the internal elements needs to be considered in the test pattern group used for the inspection method for detecting the fault by means of the static current. The internal elements are turned into observable states in which the fault can be observed by controlling the internal elements and when there is a fault in the internal elements being controlled, the fault can be detected by means of the static current that flows via the fault. The semiconductor device may be a device having single functions like a memory chip or a device like a microprocessor in which a plurality of functional cells are built in.

Thus, the method for inspecting the semiconductor device of the present invention is a method for inspecting a semiconductor device having at least one functional cell comprising a plurality of internal elements, the method comprises, and at least repeats, the steps of: controlling states where patterns selected and applied to the functional cell, in order, from a static current inspecting pattern group, that controls and turns the state of each internal element into an observable state, in which the static current flows due to a fault; detecting the static current, which is a very weak current that flows in a power circuit of the functional cell, after applying the patterns to the cell; and comparing measured static current with a specified value.

This method also allows for carrying out inspection based on both the detection of static current and a conventional method based on output patterns for the semiconductor device, or a part of the functional cells, at the same time. For such inspection, an inspection method may be used comprising, and repeating, the steps of: controlling states wherein patterns selected and applied to a functional cell, in order, from a inspecting pattern group that drives at least one internal element; determining whether patterns are those included in a static current inspecting pattern group that controls and turns states of each internal element into an observable state wherein static current flows due to a fault; detecting the static current, which is a weak current flowing in a power circuit of the functional cell, after the patterns included in the static current inspecting pattern are applied; and comparing the static current with a specific current.

In order to effectively carry out inspection based on detection of the static current, it is important to apply patterns that can effectively control and turn the internal elements into observable states for the device. To make the static current inspecting pattern group as an aggregate of such patterns, it is possible to adopt an input value adjusted pattern group in which input values are adjusted so that at least one internal element may be controlled and turned into an observable state based on circuit information for the functional cell of the semiconductor device to be inspected. The patterns contained in the input value adjusted pattern group need not be the same as those in conventional test patterns which are generated while primarily being aimed at propagating a fault at an output to be able to observe the occurrence of a fault in the internal elements, but may be those that can control and turn the internal elements into observable states. Accordingly, the input value adjusted pattern group can be formed in a short time and the use of the pattern group effectively enables carrying out of an inspection based on static current.

As with the static current inspecting pattern group, it is also possible to adopt a retrieving pattern group which is formed by extracting patterns suitable for measuring the static current by retrieving states of the internal elements, controlled by a group of patterns included in the inspecting pattern group, from a plurality of inspecting pattern groups, manually registered or automatically generated, based on circuit information. Moreover, in order to improve the efficiency of the inspection, it is effective to adopt a first optimized inspecting pattern group extracted, in order, from patterns that can drive internal elements having less frequency to turn into an observable state among patterns included in an inspecting pattern group that can drive at least one internal element. The pattern group optimized by such a method is selected from patterns at least necessary, and allows maximizing the number of internal elements that turn into observable states. At the same time, this enables elimination of patterns that control internal elements so as to turn them into observable states by previously selected patterns and, thereby, improves the efficiency of inspection.

To make a pattern group that allows effective inspection of the device, it is also effective to adopt a second optimized inspecting pattern group which is extracted, in order, from patterns that contain larger numbers of internal elements that turn into observable states among patterns included in an inspecting pattern group that can drive at least one internal element. This pattern group is selected from patterns that are more likely to create observable states and, thereby, allows shortening of the inspection time.

That the internal elements are in an observable state which is a state in which the static current flows due to a fault, can be determined from the states of nodes (connecting point) that connect internal elements. In an inspection method observing changes of the node state, when there is a degenerate fault in the input or output nodes of the internal elements, a current path can be established between the nodes in which the degenerate fault is caused and $V_{dd}$ or $V_{ss}$, and an observable state in which the static current flows can be made by setting the node state either to 0 or 1. In such an inspection method, a node control pattern group that controls the nodes, which are connecting points for connecting the internal elements, are used as the static current inspecting pattern group and the observable state is judged by the state of the nodes.

Furthermore, an inspection method observing states of MISFETs that comprise the internal elements is also useful. In the internal elements, results of logical operation by combinations of ON and OFF states of the MISFETs are output as 0 or 1 signals, but the output signals are not inverted or become unstable states and the given functions are not performed if there is a leak (off-leak) in the OFF state of the MISFETs. An off-leak is also generated by transistor faults that do not affect initial functions like failure in the gates. Because of this, even when a MISFET having such an off-leak is contained, a current path may be established between $V_{dd}$ and $V_{ss}$ and the static current flows by combining states of other MISFETs. Accordingly, in the inspection method for observing an off-leak, a transistor control pattern group that controls ON/OFF states for the MISFETs, that comprise the internal elements, may be adopted as a static current inspecting pattern group, and the observable states may be judged by a specific ON/OFF state of the MISFETs that comprise the internal elements. Then the method effectively allows detection of functional faults of the semiconductor device involving off-leaks and faults in the transistors that pose a problem in terms of long range reliability.

When the node control pattern group or the transistor control pattern group are adopted, patterns are included that establish both states in which a path through which static current flows due to a degenerate fault or due to when an off-leak is created in the states of the internal elements, so that the probability of detecting other faults at the same time is considerably high. Accordingly, basing inspection on the static current using pattern groups as described above allows detection of such faults that pose a problem in terms of long range reliability, like failures in transistors, leak current, and faulty gates in the semiconductor device, caused in the process involving semiconductors, simultaneously and effectively in addition to functional faults of the semiconductor device inspected using test pattern groups in the conventional inspection method.

Furthermore, the inspection may be carried out using a control pattern group for which patterns included in either the node control pattern group or the transistor control pattern group are extracted. This inspection allows detection of degenerate faults and off-leak faults. It also allows, of course, detection of the aforementioned failures involving the aforementioned long range reliability.

Such an inspection method facilitates carrying out periodic inspections of semiconductor devices during operation, and selection of defective devices. Then, highly reliable semiconductor devices may be produced by adopting this inspection method in an inspection process for the semiconductor device production process. Furthermore, this inspection method requires no terminals nor additional circuits for inspection, so that it is best suited for producing highly functional and highly integrated semiconductor devices, and avoiding the labor otherwise needed for connecting extra terminals and the trouble also caused by periodic inspections and fault diagnoses.

The above inspection may be carried out by a system for inspecting a semiconductor device, the system comprising at least state controlling means for controlling states based on patterns selected, in order, from a static current inspecting pattern group that controls and turns states of each internal element into an observable state in which the static current flows due to a failure, and static current comparing means that compares the static current, which is a very weak current that flows in a power circuit of the functional cell, controlled by a state controlling means with a specified value.

When inspections based both on the static current and on the result of conventional fault simulations are carried out, it is desirable to use an inspection system that at least comprises an internal element driving means that drives internal elements based on patterns selected, in order, from the inspecting pattern group that drives at least one internal element, pattern discriminating means for judging whether the patterns are ones included in the static current inspecting pattern group that control and turn states of each internal element into an observable state in which the static current flows due to a failure, and static current comparing means for comparing the static current, which is a very weak current that flows in a power circuit of the functional cell, with a specified value after the patterns included in the static current inspecting patterns are applied. The static current is a current that flows in the power circuit in a state in which the internal elements are stable and fixed to $V_{dd}$ or $V_{ss}$, so that it is desirable to measure the static current after a certain period of time, a few micro- to milli-seconds for example, passes after the patterns are applied. Accordingly, the inspection may be effectively carried out by measuring the static current when the patterns that turn the internal elements into observable states are applied, not measuring the whole test patterns.

For the static current comparing means, a circuit may be used that is provided with a voltage follower circuit connected to the power circuit of the functional cell, and a determining circuit for determining the static current based on a difference of voltage between input and output voltages of an operational amplifier used for the voltage follower circuit. The use of the voltage follower circuit enables keeping the power voltage constant even when a weak current flows, so that it allows accurate detection of the static current without having changes in the amount of current along with fluctuation of the voltage. It is also possible to determine the static current based on the difference of the input and output voltages of the operational amplifier used for the voltage follower circuit. The static current may be determined, and the difference of the voltage may be easily amplified, without affecting the impedance of the current path by determining the static current from the difference of the voltage of the input and output voltages.

As a static current inspecting pattern group used for these inspection systems, the input value adjusted pattern group, the retrieved pattern group, the first and second optimized pattern groups, the node control pattern group, and the transistor control pattern group described above may be used, and the use of those pattern groups enables effective carrying out of the inspection.

The static current inspecting pattern group used for those inspections and the inspection systems may be created by a system for creating inspecting patterns having at least input value adjusting means for adjusting input values so that at least one internal element can be controlled and turned into an observable state based on the circuit information registered for the functional cell, and on the observable state of the internal elements that comprise the functional cell, and for creating an input value adjusted pattern group which becomes the static current inspecting pattern group.

In this system for creating patterns, it is enough if input value adjusted patterns that can control and turn states of the internal elements into observable states are created, and the patterns need not be ones that mainly aim at propagating faults to the outputs like those used in conventional inspection. As a result, the time necessary for creating the static current inspecting pattern can be short. Therefore, the process for creating test patterns, which used to take a lot of time in the past, can be considerably shortened.

Furthermore, it is also possible to select the static current inspecting pattern group from a manually registered or automatically generated inspecting pattern group. In this case, the static current inspecting pattern group may be created by a system for creating inspecting patterns comprising simulation means for performing logical simulations on each inspecting pattern included in the inspecting pattern group that drives at least one internal element, modeling the functional cell and the registered internal elements, element state memorizing means for memorizing the element state of each internal element controlled by the inspecting patterns in the logical simulations, and pattern retrieving means for retrieving patterns that can control and turn the internal elements into observable states in which the static current flows due to a failure from the inspecting pattern group based on the element state, and for creating the static current inspecting pattern group. In a semiconductor device having numbers of internal elements and a high degree of integration, it often takes time to create inspecting patterns that control and turn the internal elements into observable states. In such a case, it is effective to select patterns that control and turn the internal elements into observable states by carrying out logical simulations on the inspecting pattern group, manually registered or automatically generated, based on the circuit information for the functional cell, by memorizing the element states of the internal elements which are the result of being driven by the inspecting patterns, and by retrieving observable states from the element states. Then it becomes possible to create the static current inspecting pattern group by an aggregate of such patterns.

Furthermore, inspection based on detection of the static current can be carried out so long as the state of the elements become observable and does not require judgement on observability whether faults can be detected at the output of the circuit or the functional cell as in conventional inspection. Accordingly, the system for creating patterns used for inspection only needs to have simulation means, element state memorizing means, and pattern retrieving means, noticing on the controllability of the state of the internal elements. Thus the system for creating the pattern groups used for inspection based on the static current may be simplified and the time necessary for creating the pattern group may be shortened.

In the system as described above, the pattern retrieving means may be a first optimized retrieving means for creating the static current inspecting pattern group which extracts, in order, from patterns that turn the internal elements having less frequency in becoming observable states into observable states from the inspecting pattern group. In this case, the first optimized retrieving means may comprise a low-drive internal element retrieving means for retrieving low-drive internal elements which are internal elements having less frequency to change from an element state to an observable state, and first optimized pattern extracting means for creating the static current inspecting pattern by extracting, in order, from patterns that turn the low-drive internal elements into observable states from the inspecting pattern group.

The pattern retrieving means may also use a second optimized retrieving means for creating the static current inspecting pattern group by extracting, in order, from patterns having more element states controlled and turned into observable states from the inspecting pattern group. In this case, the second optimized retrieving means may comprise a second optimized pattern extracting means for extracting patterns having more element states controlled and turned into observable states, and element states reducing means for erasing the observable states realized by the patterns extracted from the element states to update the element states. The use of the first or second optimized retrieving means allows creation of a static current inspecting pattern group having fewer overlaps in inspections while controlling and turning many internal element states into observable states. Then, the use of the optimized static current inspecting pattern group allows carrying out accurate and effective inspections in a short time.

Furthermore, the observable state may be judged using states of the nodes as described above, and in this case, it is preferable to use the node control pattern group for controlling the nodes which are connecting points for connecting the internal elements as the static current inspecting pattern group.

Moreover, the observable state may be judged using specific ON/OFF states for the MISFETs that comprise the internal elements. In this case, it is effective if the static current inspecting pattern group is the transistor control pattern group for controlling the ON/OFF state of the MISFETs that comprise the internal elements. Moreover, it is possible to judge the observable state by the nodes and by specifying ON/OFF selection for the MISFETs, and as the static current inspecting pattern group, a control pattern group comprising patterns included either in the node control pattern group for controlling the nodes, which are connecting points for connecting the internal elements, or in the transistor control pattern group for controlling the ON/OFF states of the MISFETs that comprise the internal elements, may be used.

BRIEF DESCRIPTION OF THE DRAWINGS

Other objects and attainments together with a fuller understanding of the invention will become apparent and appreciated by referring to the following description and claims taken in conjunction with the accompanying drawings.

Embodiments of the present invention will now be described with reference to the accompanying drawings, wherein:

FIG. 15 is an explanatory drawing showing a part of the file output of a node state memory file (IQC);

FIG. 16 is an explanatory drawing showing a part of the file output of a frequency file (STF);

FIG. 17 is an explanatory drawing showing a part of the file output of a 0-state file (IQL);

FIG. 18 is an explanatory drawing showing a part of the file output of a 1-state file (IQH);

FIG. 19 is an explanatory drawing showing a part of the file output of a sorted 0-state file (IQLOW);

FIG. 20 is an explanatory drawing showing a part of the file output of a sorted 1-state file (IQHIGH);

FIG. 24 is an explanatory drawing showing a part of the file output of a primitive internal state file (EVST);

FIG. 25 is an explanatory drawing showing a part of the file output of a maximum event file (MEV)

DESCRIPTION OF THE PREFERRED EMBODIMENTS

About Static Current

Figure 1:
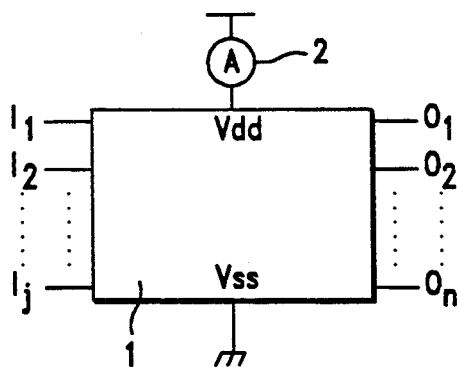
FIG. 1 is an explanatory drawing showing an outline of the measurement of static current IQ.

First, the use of static current in the present invention for determining the quality of a semiconductor device will be explained. As shown in FIG. 1, IQ (static current) is a current that flows between $V_{dd}$ and $V_{ss}$ power supply circuit connections in an IC (semiconductor integrated circuit device) 1. In order to avoid the effects of drive current cause by gates within the IC 1 being driven, IQ is measured after a certain period of time has passed since test patterns have been inputted to input terminals $I_l$ to $I_j$, resulting in a state in which the gates are fixed. An ampere meter 2, for measuring IQ may be also installed on the $V_{ss}$ side, instead of the $V_{dd}$ side as shown in FIG. 1, and it is also possible to detect IQ using a comparison means like a comparator, not necessarily by an ampere meter, so long as the quality is determined. By the way, this IQ may be measured not only between power circuits for the whole IC, but also for each specific cell structure in the IC, e.g. each functional cell having an independent power circuit in memory, logical, and the like cells.

Although various faults may be detected by measuring IQ, the relationship of a degenerate fault and an off-leak for a MISFET to IQ is outlined below.

Figure 2A:
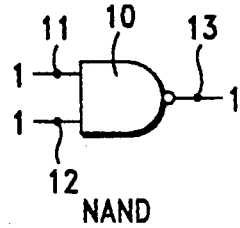
FIG. 2 is an explanatory drawing showing a state wherein IQ flows when an output of a NAND gate has a degenerate fault to 1, FIG. 2(a) being a view showing a node state of the NAND gate in such a state, and FIG. 2(b) being a view showing a state for transistors that comprise the NAND gate in such a state.
Figure 2B:
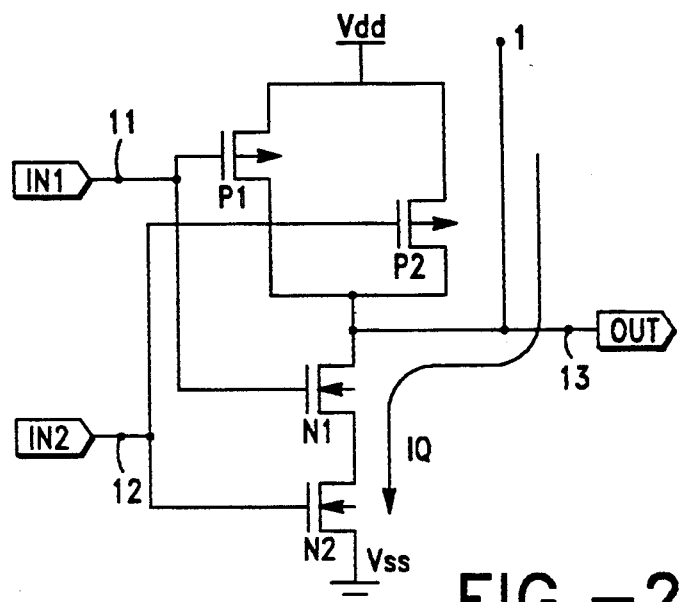
Figure 3A:
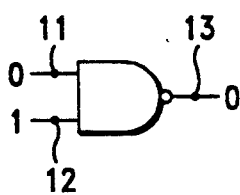
FIG. 3 is an explanatory drawing showing a state wherein IQ flows when the output of the NAND gate has a degenerate fault to 0, FIG. 3(a) being a view showing a node state of the NAND gate in such a state, and FIG. 3(b) being a view showing a state of transistors that comprise the NAND gate in such a state.
Figure 3B:
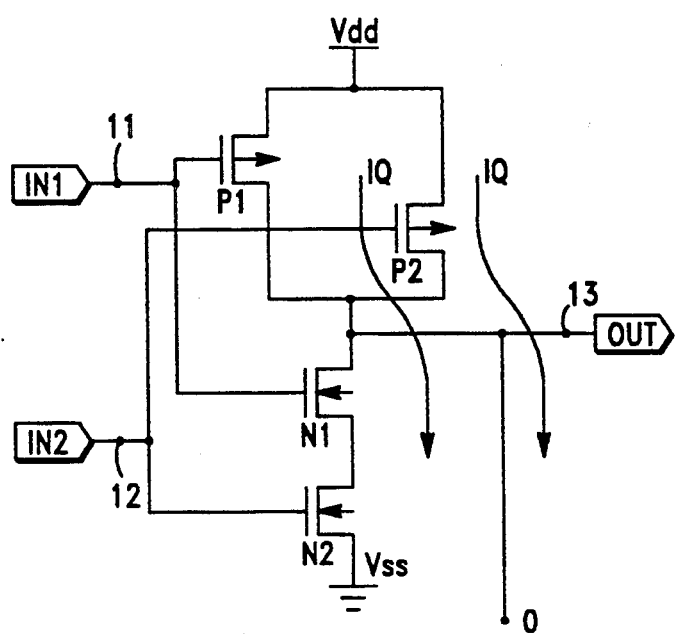

FIGS. 2 and 3 show cases where a degenerate fault is caused at an output terminal of a two-input NAND element. FIG. 2 shows a degenerate fault in which an output terminal 13 is fixed to 1. In this case, where both transistors N1 and N2 turn ON for an input, IQ flows from the output terminal 13 to $V_{ss}$. That is, IQ flows when a test pattern sets both input terminals 11 and 12 to 1 and the output terminal 13 to 0. Accordingly, in the case of a degenerate fault where the output terminal 13 is fixed to 1, a state wherein the output terminal 13 becomes 0 is an observable state, and the internal NAND element has to be controlled so that the output terminal 13 becomes 0 to determine whether a degenerate fault exists or not.

IQ has to be measured in a state in which internal elements like the NAND 10 are fixed, in order to avoid the effects of current in a drive state. The state in which a certain test pattern is thus applied to an IC and the internal element is fixed, is referred to as an "event" for the test pattern hereinafter.

In the case where the output terminal 13 is fixed to 0, as shown in FIG. 3, contrary to the aforementioned degenerate fault case, IQ flows from $V_{dd}$ in an event in which either transistor P1 or P2 turns ON. That is, a degenerate fault by which the output terminal 13 is fixed to 0 may be detected by measuring IQ in the event either input terminal 11 or 12 is 0 and the output terminal 13 is 1. The states of the input terminals 11 and 12, and the output terminal 13, which are the nodes of the NAND 10, turn out as shown in the following table.

TABLE 1

| Node | | | Possible to Detect | Possible to Detect |
|---|---|---|---|---|
| 11 | 12 | 13 | Degeneration to 1 | Degeneration to 0 |
| 0 | 0 | 1 | X | O |
| 1 | 0 | 1 | X | O |
| 0 | 1 | 1 | X | O |
| 1 | 1 | 0 | O | X |

Thus, the states in which the node 13 is 0 and 1 are the states in which a degenerate fault is observable in the inspection observing IQ. Then, in order to detect the degenerate fault, test patterns that control or set the node 13 to 0 and 1 need to be applied to the IC.

Figure 4A:
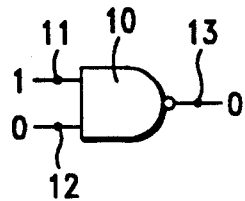
FIG. 4 is an explanatory drawing showing a state wherein IQ flows when there is an off-leak in the transistors that comprise the NAND gate, FIG. 4(a) being a view showing a node state of the NAND gate in such a state, and FIG. 4(b) being a view showing a state of transistors that comprise the NAND gate in such a state.
Figure 4B:
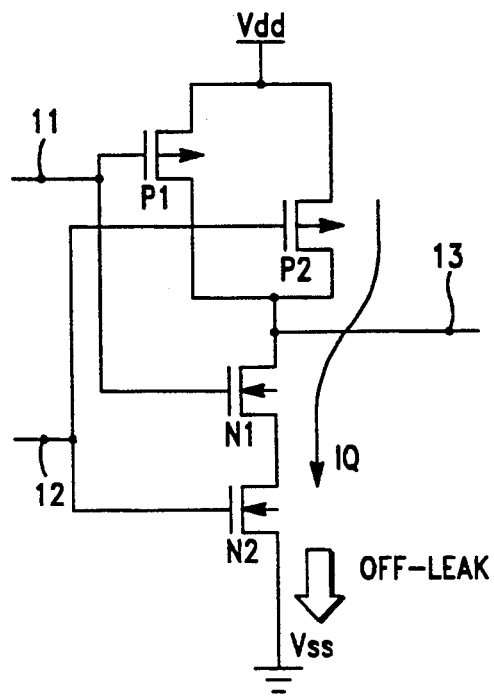

FIG. 4 shows a case where there is an off-leak in the transistor N2 in the NAND 10. When there is an off-leak in the transistor N2, IQ flows from $V_{dd}$ to $V_{ss}$ when the transistors P2 and N1 turn ON. That is, an off-leak for the transistor N2 may be detected by measuring IQ in an event in which the node 11 is 1 and the node 12 is 0. Accordingly, the state wherein the node 11 is 1 and the node 12 is 0 is the observable state for the transistor N2, and in order to detect the off-leak, test patterns that can control or set the node 11 to 1 and the node 12 to 0 need to be applied.

In the same manner, to detect an off-leak in the transistor N1, IQ is measured when the transistor P1 and N2 are ON, i.e. in an event in which the node 11 is 0 and the node 12 is 1. To detect an off-leak in the transistors P1 or P2, IQ is measured when the transistors N1 and N2 are ON, i.e. in an event in which the nodes 11 and 12 are 1. The foregoing events may be summarized as in Table 2.

TABLE 2

| Node | | | Possible to Detect Off-leak | | | | Specific State |
|---|---|---|---|---|---|---|---|
| 11 | 12 | 13 | P1 | P2 | N1 | N2 | of Element |
| 1 | 1 | 0 | O | O | X | X | A |
| 1 | 0 | 1 | x | x | x | O | B |
| 0 | 1 | 1 | x | x | O | X | C |
| 0 | 0 | 1 | x | x | x | x | |

As seen from Table 2, observable states for detecting IQ associated with the off-leak of the transistors are the specific states A, B, and C which are determined by the nodes 11, 12, and 13, and the transistor structure of the NAND 10, the internal element, in addition to the states wherein the node 13 is 0 and 1. Accordingly, to confirm the off-leak in all of the transistors that comprise the NAND 10, an internal element, a plurality of test patterns that control and set the NAND 10 into the specific states A, B, and C need to be applied to the IC.

Figures 5A, 5B:
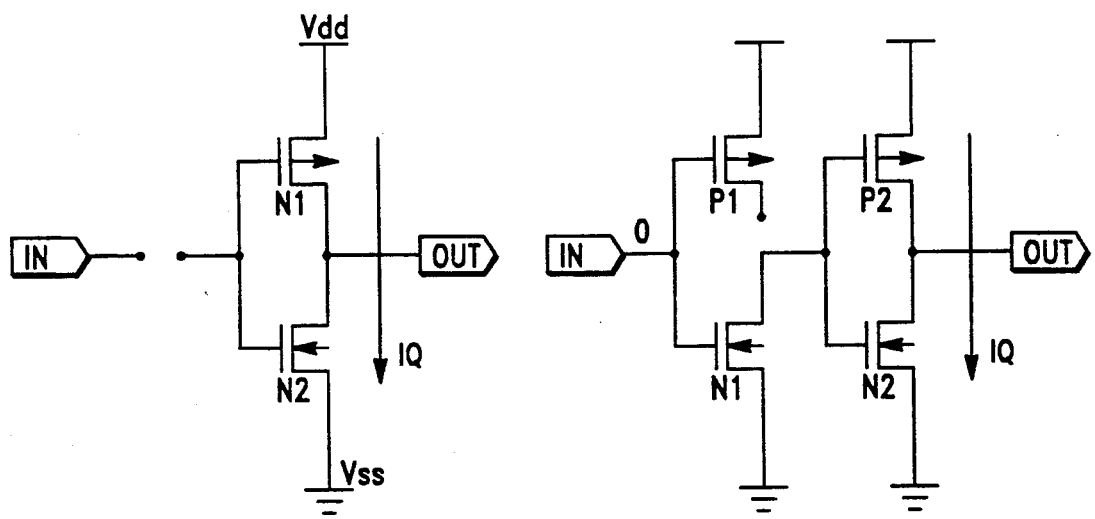
FIG. 5 is an explanatory drawing showing a state wherein IQ flows when there is an open fault, FIG. 5(a) being a view showing a case when the gate is opened and FIG. 5(b) being a view showing a case when a drain is opened.

Thus a failure may be detected by measuring IQ in an event in which the states of the internal elements are controlled and turned into observable states, i.e., in the states in which the node is 0 and 1 in the case of a degenerate fault, and in an event in which the states of internal elements are controlled and turned into specific states in off-leak detection for transistors. Besides that, there are several failures which can cause IQ to flow. For example when there is an open fault in any gate, drain or source, a gate potential of another transistor connected to the gate transistor, the drain or the source, becomes unstable as shown in FIG. 5. In such a transistor, the gate potential is often at an intermediate potential, or a switching point. Accordingly, both an n-channel transistor and a p-channel transistor of the gate are in a transient state and transient current successively flows. Because of this, the fault may be also detected by measuring the transient current as IQ.

Inspection Method and System Using Static Current

Figure 6:
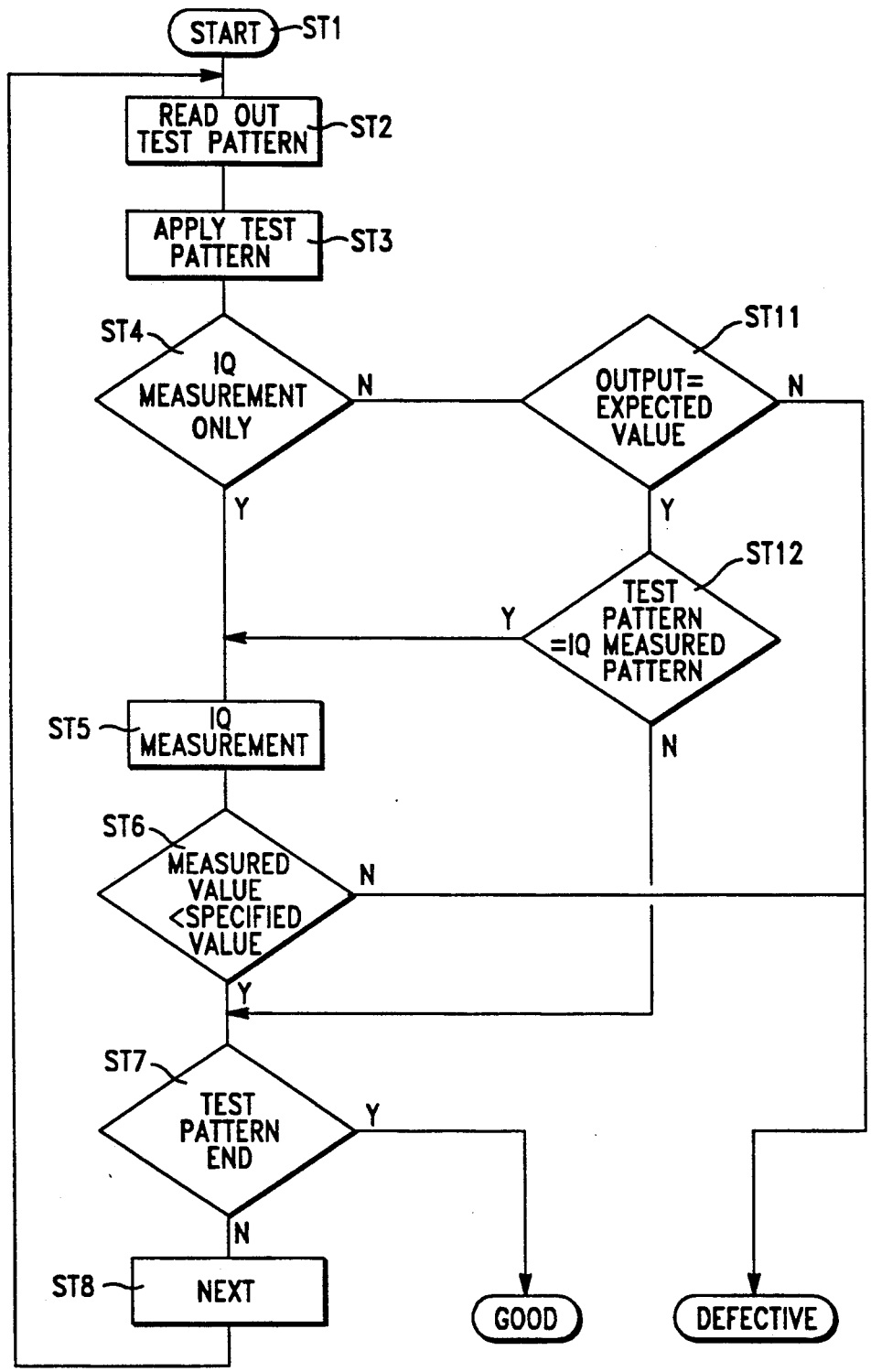
FIG. 6 is a flowchart showing an inspection method using IQ.
Figure 8:
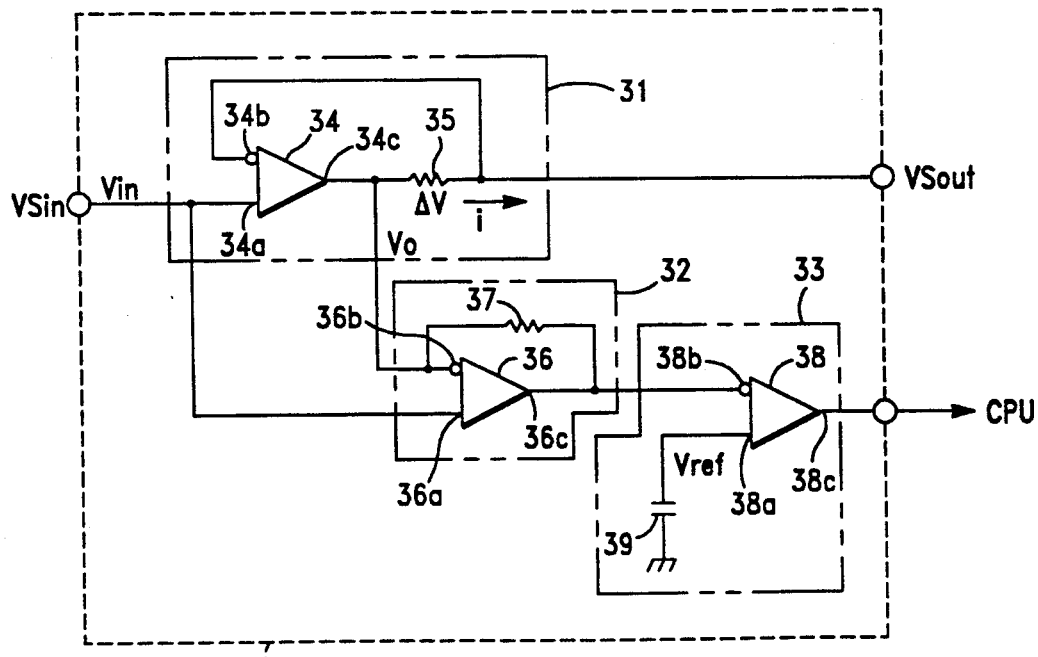
FIG. 8 is a circuit diagram showing a structure of a static current comparing section used in FIG. 7.

FIGS. 6 and 8 show one example of the inspection method and the inspection system using IQ (static current). The inspection method and system of the present example are adapted to be able to detect the quality of a semiconductor device from output waveforms based on test patterns selected as a result of the conventional fault simulations as an option, in addition to the IQ measurement. Inspection for detecting the quality of an IC (semiconductor device) by measuring IQ is carried out in accordance with a flow chart shown in FIG. 6. Each step thereof is explained below.

Step ST1: The inspection process is started after connecting an I/O unit, a power unit, and an IQ measuring unit, to input/outputs and power circuits of the IC to be inspected.

Step ST2: Stored test patterns are called out, or selected. The test patterns are those selected, in order, from a test pattern group for measuring IQ created by a pattern creation unit described later. It is also possible to add a test pattern group selected by fault simulations to the test pattern group for measuring IQ and to create a test pattern group from circuit information for the IC, in this step.

Step ST3: Patterns are generated by a pattern generating unit based on the test patterns selected or called out in Step ST2 to apply to each input terminal I of the IC.

Step ST4: The inspection to be executed is determined by whether only IQ is to be measured or whether the quality is also to be detected by comparison with fault simulations provided as an option. The process proceeds to Step ST 11 when a comparison with fault simulations is also performed.

Step ST5: IQ, which is a very weak current that flows in a current circuit, is measured after the circuits within the IC become stable or are stabilized by, from the test patterns applied in Step ST3.

Step ST6: If the measured value of IQ from Step ST5 is less than a specified value, it is determined that there is no fault in the internal elements and on the circuit to be detected by the test patterns applied in Step ST3 and the process proceeds to Step ST7. On the other hand, if the measured value of IQ is not less than the specified value, the semiconductor device is determined to be defective since there exists a path where IQ flows due to some fault.

Step ST7: Next, it is determined whether or not any test patterns of the test pattern groups prepared for application to the IC, to measure IQ, are left without having been applied. If the measurement of IQ has been finished using all the prepared test pattern groups, the IC is determined to be good, since IQ was less than the specified value in all of the prepared test pattern groups and there is no fault detectable by the test pattern groups. Then the IC is subjected to other inspections, as applicable. If patterns of the test pattern group prepared have not been finished, the process proceeds to Step ST8.

Step ST8: The measured value of IQ in the test pattern is cleared and the process returns to Step ST2 to measure IQ in the next test pattern. The aforementioned steps are repeated until all of the patterns in the prepared test pattern group are finished.

Step ST11: When the comparison with fault simulations prepared as an option is made, an output pattern that corresponds to the test patterns applied to the input terminal of the IC in Step ST3 are compared with an expected value output by the fault simulations. If the output pattern agrees with the expected value, no fault has propagated to the output pattern and the process proceeds to Step ST12. When the output pattern does not agree with the expected value, the output pattern has been charged due to a fault and the IC is determined to be defective. The expected value compared in this step need not be an expected value in the fault simulation as in this example. It is possible to apply the same test pattern to an IC already determined to be good for comparison with that result.

Step St12: Whether the test pattern applied to compare with the result of the fault simulation is one of the test pattern group registered for inspecting IQ, is determined. If the applied test pattern is one of the test pattern group registered for inspecting IQ, the process moves to Step ST5 and quality determination is based on the measurement of IQ and the measured result thereof.

Even if the same test patterns are applied to an IC, some patterns do not propagate a fault into an output pattern. However, if it is an observable state in which the fault can be observed by observing IQ, the fault can be detected by measuring IQ regardless of the actual output pattern. Accordingly, for the IC not determined to be defective in Step ST11, IQ is measured in Step ST5. The number of patterns included in the test pattern group used for measuring IQ can be also less than the number of patterns included in the test pattern group provided for comparing with a fault simulation because observability need not be taken into consideration. Due to this, IQ need not be measured for the whole test pattern group provided for comparison with fault simulations. Accordingly, when the applied test patterns are not included in the test pattern group used for measuring IQ, the process moves to Step ST7 without measuring IQ, to carry out inspection by the next test pattern.

Thus process or design faults of circuits in the semiconductor device which used to be detected in the past by comparison with the results of fault simulations can be detected by inspection with measuring IQ. IQ related to those failures can be measured if the states of internal elements that comprise the circuit becomes observable states in which IQ flows due to failures, so that a test pattern group in which observability for the output pattern is taken into consideration need not be used, differing from the previous methods. Accordingly, it is possible to considerably reduce the number of patterns included in a test pattern group which used to increase due to the observability requirement in the conventional inspection method. Furthermore, the relationship between internal elements need not be considered because it is enough if the state of each internal element can be controlled and turned into an observable state. That is, even if a plural number of internal elements turn into observable states at the same time, it is possible to detect a fault, if it exists, by measuring IQ. Therefore, the number of test patterns used for inspection can be reduced further by controlling and turning the plurality of internal elements into observable states. Accordingly, it is possible to considerably reduce the time necessary for inspecting the IC and to even inspect semiconductor devices having high integration density and a high functionality, accurately and in a short time.

Furthermore, observability at an output terminal need not be taken into consideration in the semiconductor device whose fault is to be detected by measuring IQ. Due to this effect, such previous methods as the scan-pass method which aims at adding output-terminals to improve observability and to prevent an increase in test patterns, need not be adopted. Accordingly, in a semiconductor device produced by adopting this inspection process, no additional circuit for inspection is necessary and the same reliability obtained for the semiconductor device using scan-pass and other inspection methods, may be maintained without having additional circuits. Therefore, even in a highly integrated semiconductor device, reliability can be improved while preventing an increase in the area due to additional circuits.

Figure 7:
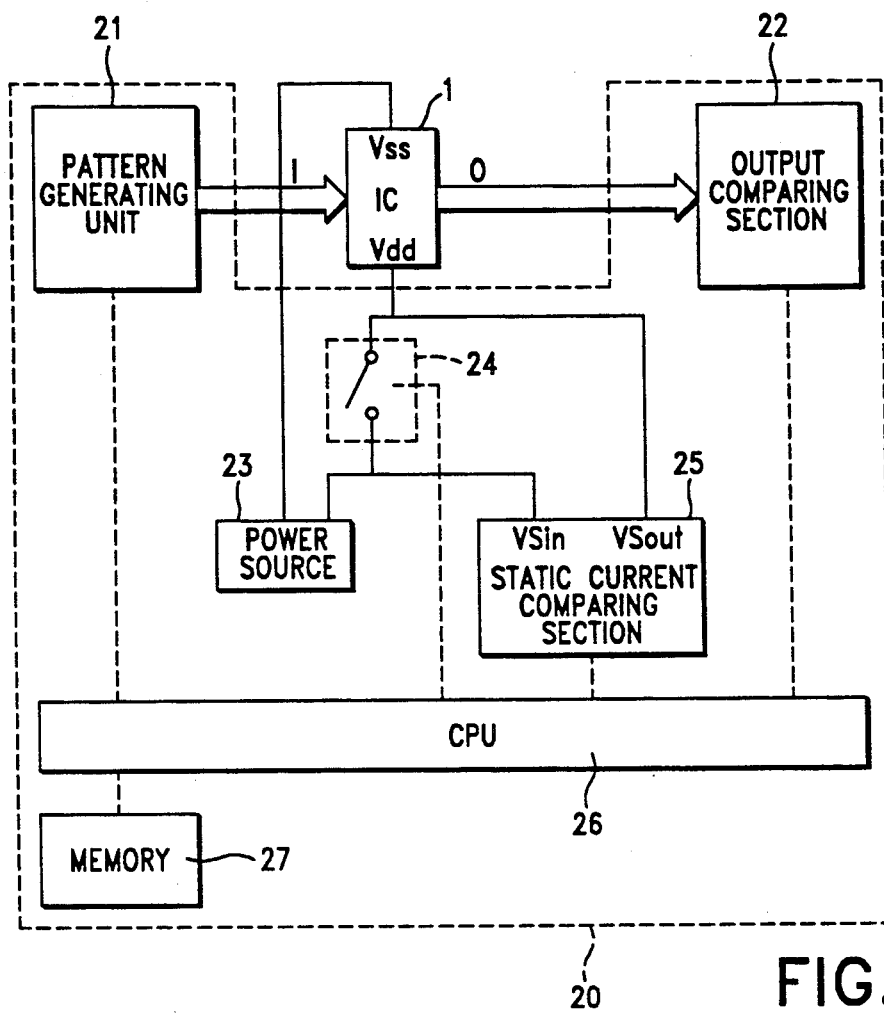
FIG. 7 is an explanatory drawing showing an outline of an inspection system used for the inspection shown in FIG. 6.

FIG. 7 shows one example of a system used for the aforementioned inspection method. An inspection system 20 uses a CPU 26 for controlling functions such as the selection of test patterns from a test pattern group stored in a memory 27, a pattern generating unit 21 for generating patterns based on the test patterns selected and for applying them to an IC 1, a power source unit 23 for supplying power to the IC 1; a power source switch 24 that switches a power source supply line to measure IQ after the internal elements are fixed by applied patterns, a static current comparison section 25 that measures IQ in a state wherein the internal elements are stabilized and compares the measured value with a specified value, an output comparing section 22 that optionally compares results of fault simulations and output patterns for the IC, and a memory 27 in which the test pattern group created for measuring IQ is stored. In the memory 27, when the optional comparison with fault simulations is required, a test pattern group used for fault simulations and an output pattern group which represents an expected value for the test pattern group are stored together.

The inspection system 20 carries out the quality inspection of the IC 1 based on the measurement of IQ as described above. At first, patterns are selected, in a predetermined order, from the test pattern group stored in the memory 27 by the CPU 26 and applied to the IC 1 by the pattern generating unit 21. At this time, the power unit 23 is connected directly to a power circuit $V_{dd}$ and $V_{ss}$ for the IC 1 to supply power as necessary for the internal elements driven by the applied patterns. After a certain period of time after the state of the internal elements is stabilized, the switch 24 is opened at the direction of the CPU 26. Then the power unit 23 is connected to the IC 1 through the intermediate static current comparing section 25, and the value of IQ is compared to the specified value while the internal elements are in a stable state.

If the measured value of IQ is less than the specified reference value, the next test pattern is selected from the test pattern group stored in the memory 27 by the CPU 26 and applied to the IC 1 by the pattern generating unit 21. At this time, the switch 24 is returned to a state where power is supplied directly to IC 1 from power unit 23 at the direction of CPU 26. On the other hand, if the measured value of IQ is not less than the specified reference value, then IC 1 is determined to be defective by the CPU 26. The system 20 indicates that IC 1 is defective and finishes the inspection process.

When the optional comparison with fault simulation is made, a pattern is selected from the test pattern group used for the fault simulations and stored in the memory 27 by the CPU 26, and is applied to IC 1 through the intermediate pattern generating unit 21. Then, an output pattern from IC 1 is detected by the output comparing section 22 and is compared with the expected value supplied from the memory 27 through intervening CPU 26. If the output pattern obtained does not agree with the expected value, the CPU 26 determines that IC 1 is defective and finishes the inspection process, indicating the result. When the output pattern obtained agrees with the expected value, the CPU 26 judges whether the test pattern is one included in the test pattern group for measuring IQ. When IQ is measured, the switch 24 is opened and measured IQ is compared with by the static current comparing section 25.

However, an inspection system which does not use the optional comparison with fault simulation results, can do without the output comparing section 22. In this latter case, the memory 27 may also have a small memory capacity since the test pattern group used for simulation and output pattern groups which are the expected values thereof also need not be stored. Accordingly, the inspection system 20 can made compact in size, so that it is suited as an inspection system used for periodic inspection and fault diagnosis of ICs in operation. Moreover, when the capacity of the memory 27 is large, it is possible to store test pattern groups of various ICs or to create test pattern groups by carrying out simulations for every circuit to be inspected. Such an inspection system may be used in the production process for semiconductors.

Although it is possible to structure the static current comparing section 25, of the inspection system 20, using various apparatus such as an ampere meter and a current comparator, IQ is typically converted to a voltage and then amplified for comparison with a reference voltage to determine a measured value for IQ in this exemplary system, as shown in FIG. 8.

FIG. 8 shows the main components of the static current comparison section 25. The static current comparison section 25 uses a voltage follower circuit 31 to keep a predetermined voltage on an output terminal $VS_{out}$ even if current flows from an input terminal $VS_{in}$ to the output terminal $VS_{out}$, an amplifying circuit 32 that amplifies the voltage difference, $\Delta V$, in the voltage follower circuit 31, and a comparing circuit 33 that compares the amplified voltage V1 with the reference value.

In the exemplary voltage follower circuit 31, a voltage follower using an operational amplifier 34 is adopted. That is, a non-inverting input 34a of the operational amplifier 34 is connected to the input terminal $VS_{in}$ and an output 34c of the operational amplifier 34 is connected to the output terminal $VS_{out}$ through a resistor 35. Then, the output terminal side, $VS_{out}$, of the resistor 35 is connected to an inverting input 34b of the operational amplifier 34 to form the voltage follower. When a very weak current i flows from $VS_{in}$ to $VS_{out}$ in such circuit, a voltage drop $\Delta V$ is created due to the resistor 35. As a result, an output voltage VO is derived according to the following expression:

$$V_{in} - (V1 - \Delta V) = VO/\mu \quad (1)$$

where $V_{in}$ is a voltage at the non-inverting input 34a of the operational amplifier 34 and VO is the voltage at the output 34c. When $\mu$, which is an amplification factor for the operational amplifier 34, is very large, the right side of expression (1) becomes 0, so that the output voltage VO at the output 34c becomes:

$$VO = V_{in} + \Delta V \quad (2)$$

Accordingly, the very weak current i that flows between the terminals $VS_{in}$ and $VS_{out}$ can be detected by measuring the voltage difference between the non-inverting input 34a and the output 34c of the operational amplifier 34. Moreover, since a voltage follower is used, the voltage on $VS_{out}$ can be kept constant even if the current i is flowing. Therefore, the static current can be detected, eliminating current detection error associated with a fluctuation in the voltage.

An amplifying circuit 32 has a resistor 37 connected in parallel with another operational amplifier 36 between the operational amplifier 34 and an inverting input 36b, and an output 36c of the operational amplifier 36. Therefore, the difference $\Delta V$ of the voltage $V_{in}$ inputted to a non-inverting input 36a (34a) of the operational amplifier 36 and the voltage VO inputted to the inverting input 36b is amplified to emerge as voltage V1 at the output 36c. This output voltage, V1, is compared and discriminated by the comparing circuit 33.

In the exemplary comparison and discrimination circuit 33, the voltage V1 inputted to an inverting input 38b and a reference voltage $V_{ref}$ of a battery 39 inputted to a non-inverting input 38a, are compared using a comparator 38. As a result, when the voltage V1 is higher than the reference voltage $V_{ref}$, i.e. when the static current IQ is higher than the specified value, a high level signal is output from the comparison and discrimination circuit 33.

Although one example of a system has been shown here for which test patterns are applied and the current IQ measured from outside of the semiconductor device, it is also possible to realize the pattern generating unit and static current comparison circuit within the semiconductor device, so as to make a semiconductor device that can diagnose itself. Furthermore, it is also possible to facilitate inspection by adding scanning flip-flops, and the like, to the semiconductor device, and measuring IQ in order to improve the controllability of changing the internal elements into observable states.

System for Creating Test Patterns Used for Inspection Based on Static Current

Figure 9:
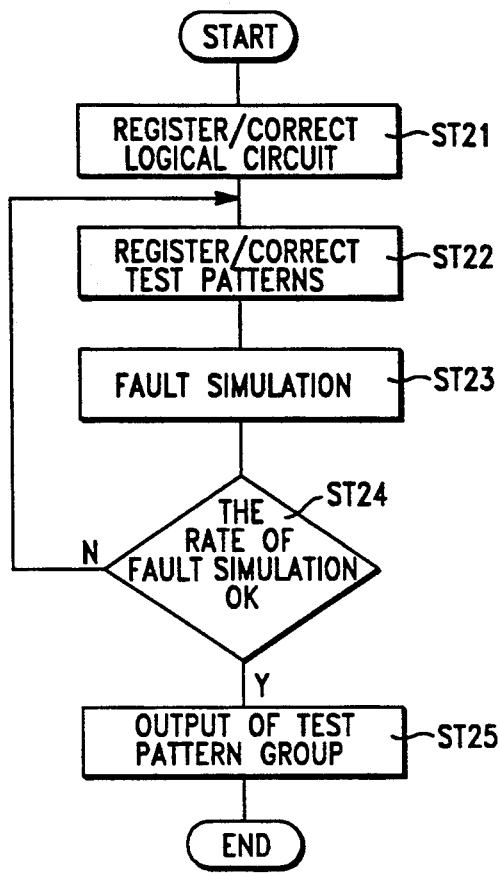
FIG. 9 is a flowchart showing process flow in a prior system for creating test patterns.

In inspecting the quality of a semiconductor device based on detection of IQ as described above, creation of test patterns to be applied to the semiconductor device is an important element in carrying out the inspection effectively and in a short time, with a high fault-detection rate. Conventional inspection test patterns are selected based on fault simulations. FIG. 9 shows an example of process flow in a system for creating conventional inspection test patterns. At first, a logical circuit for a semiconductor device to be inspected is registered (ST21). Based on the logical circuit information, a test pattern group is registered (ST22). In a semiconductor device having fewer gates comprising the circuit, the patterns are manually registered, but in devices having larger numbers of gates, they are generally automatically produced by a random number method, D algorithm and the like, and are verified by the fault simulations that follow (ST23). As a result of the fault simulations, if the number of faults detected by the registered test pattern group is small, that is, the patterns included in the test pattern group has a low fault-detection rate, test patterns are added and changed to carry out the fault simulations again (ST24). When the detection rate cannot be improved even if test patterns are added and changed, the circuit design itself is sometimes reviewed. Then, if a certain fault detection rate is achieved, its test pattern group is output (ST25).

Figure 10:
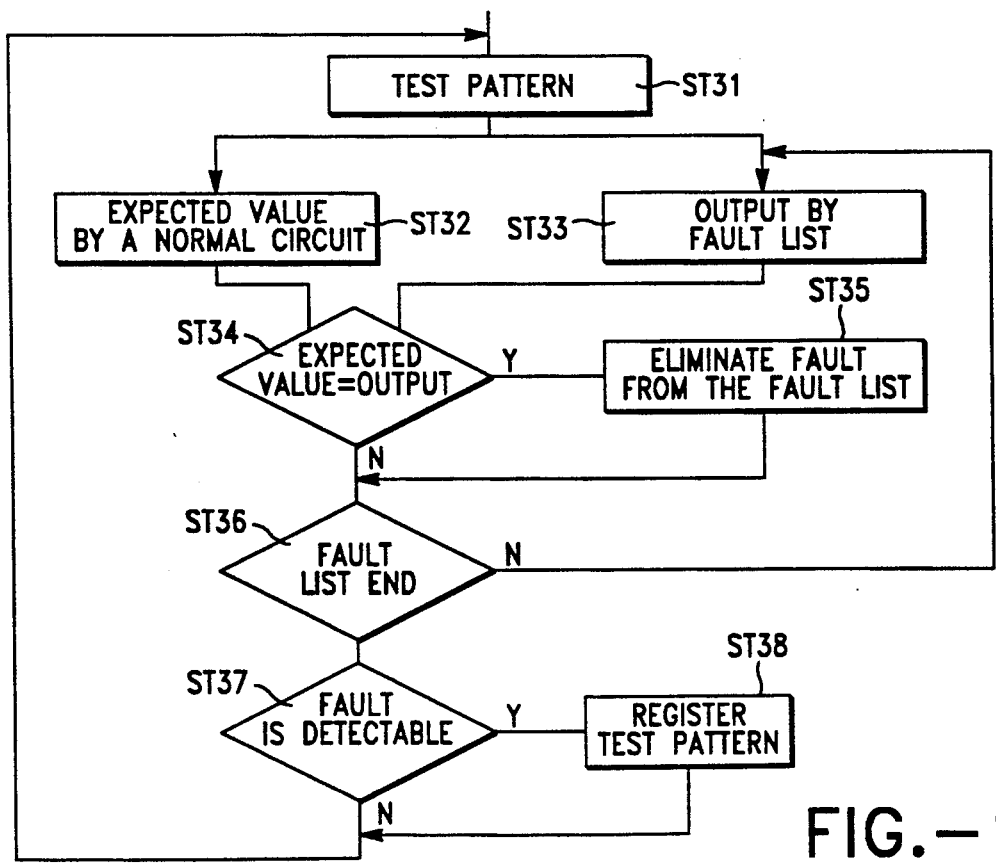
FIG. 10 is a flowchart showing a detail process flow for a fault simulation shown in FIG. 9.

In the conventional inspection method, it is important to verify whether a fault is observable even in the fault simulations since a test pattern group that satisfies both controllability for inducing the fault and observability for observing the fault has to be created. FIG. 10 shows one example of the fault simulation process. First, one pattern is selected from the test pattern group which is produced automatically or manually (ST31). Then a simulation is carried out for a normal circuit to find an expected value (ST32). On the other hand, each presumed fault in the registered logical circuit is listed in a fault list and a simulation is carried out in a circuit which reflects the fault according to the list to find the output (ST33).

The expected value found in the step ST32 and the output found in the step ST33 that reflects the fault are compared (ST34). When the expected value and the output do not agree, an object fault can be observed by applying the test pattern. Therefore, that fault is eliminated from the fault list (ST35). Thus, a drop in efficiency due to double inspection is prevented. It is determined whether simulations have been carried out for each fault in the fault list and if faults still exist in the fault list, the process returns to step ST33 to repeat the above procedure (ST36).

Once simulations are finished for faults listed in the fault list, it is determined if a fault is detectable by the test patterns (ST37). The test pattern by which a fault was detected is registered to be outputted (ST38). The above process flow is repeated for each and every test pattern to extract a test pattern that can detect a fault. As described before, in the conventional inspection method, the test pattern group is formed by judging whether each fault is transmitted to the output to satisfy observability, using the fault simulations. Generally, not many faults are observed by one test pattern and the fault-detection rate cannot be improved unless a test pattern group containing a very large number of test patterns is used. Moreover, when a plurality of faults occur at the same time, the time necessary for fault simulations increases and it takes a very long time to form the test pattern group by determining if the plurality of faults are observable.

On the other hand, adopting IQ as a means for detecting faults according to the present invention enables fault detection if a state of internal elements that compose a circuit is turned into observable state in which IQ flows due to the fault, as described above. Therefore, observability at the output need not be taken into consideration and fault simulations need not be carried out as used in the conventional inspection system that creates the test pattern group.

Figure 11:
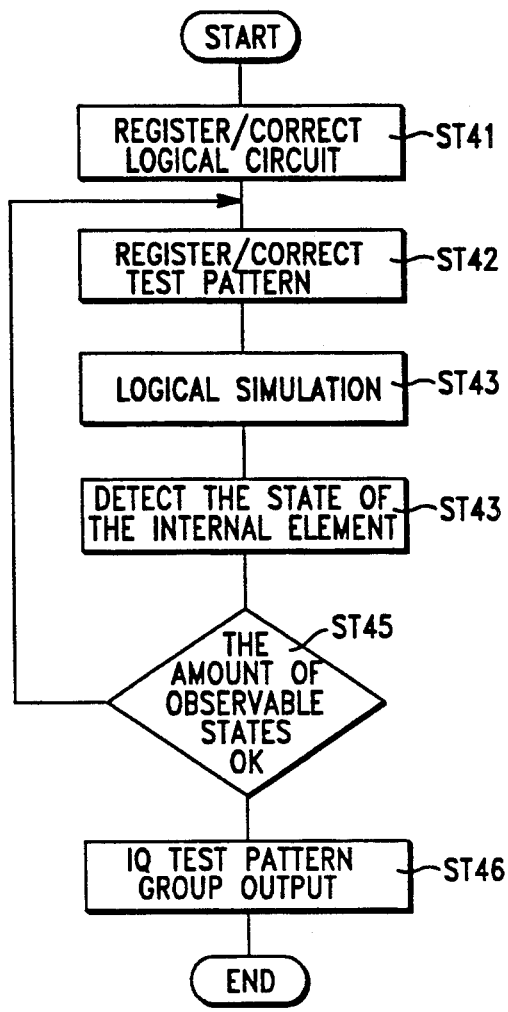
FIG. 11 is a flowchart showing process flow in a system for creating test patterns used for inspection based on the measurement of IQ for the present embodiment.

FIG. 11 shows an outline of the operation of a test pattern creating system for creating a test pattern group used for inspection based on the measurement of IQ according to the present embodiment. The content of each step is explained below:

Step ST41: The detail of a semiconductor device logical circuit to be inspected is registered. In this example, an interactive large scale circuit accommodating a logical simulator is used as described later.

Step ST42: A test pattern group is registered based on the logical circuit information. Though the test pattern group may be registered manually in the semiconductor device having fewer gates making up the structure of the circuit, generally they are automatically generated by a random number method, D algorithm and the like, in those having larger numbers of gates.

Step ST43: In order to memorize the internal state of the semiconductor device to which the registered test pattern group has been applied, logical simulations are carried out for each and every test pattern.

Step ST44: The states of the internal elements obtained from the logical simulations are retrieved and test patterns that can control and turn the elements into observable states are selected to form an IQ test pattern group.

Step ST45: Whether the amount of the observable states controlled by the IQ test pattern group created in Step ST44 is enough for judging the quality of the semiconductor device is determined. If the observable states of the internal elements are not enough, the process returns to Step ST42 to modify and add to the test patterns.

Step ST46: When enough tests in the IQ test pattern group are obtained to detect a fault, the test pattern group is output.

Thus, in the test pattern group used for inspection based on IQ, or in the system used for creating the IQ test pattern group, observability at the output need not be confirmed and the expected value for the test pattern group need not be output. Accordingly, the time necessary for outputting the test pattern group can be shortened since only the state of the internal elements needs to be observed to select test patterns to create a test pattern group. Moreover, even if a plurality of faults occur at the same time, the fault-detection rate by one test pattern is high since IQ flows corresponding to each fault and allows detection of the faults. Then, the number of test patterns registered beforehand and the number of patterns selected as the IQ test pattern group may be less than the number of test patterns necessary for conventional inspection, so that the time necessary for simulations can be shortened.

Figure 12:
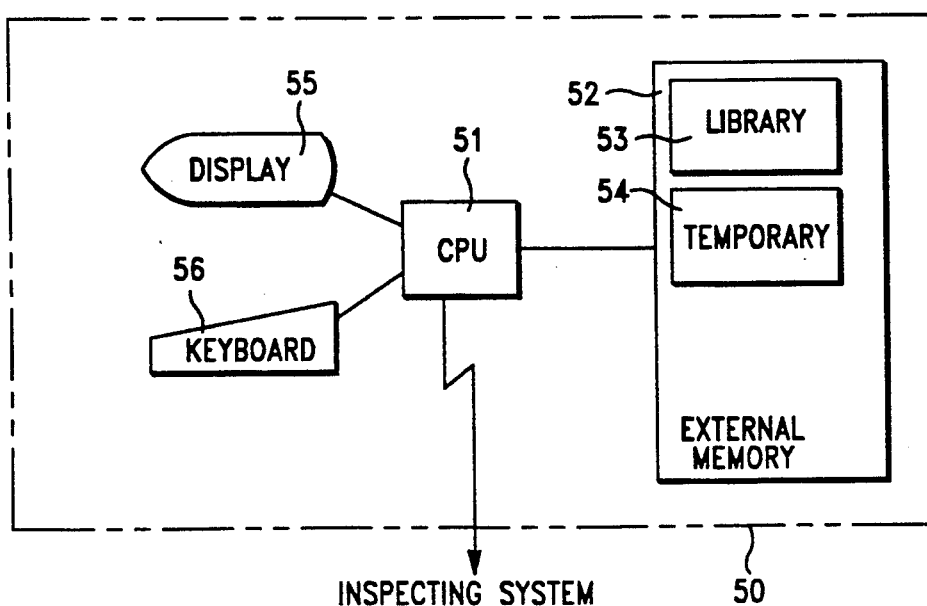
FIG. 12 is an explanatory drawing showing one example of a structure of the system for creating test patterns that can execute the processes shown in FIG. 11.

FIG. 12 shows a structure for the system for creating test patterns for the present embodiment. The present system 50 comprises a CPU 51 that controls an external memory 52 and performs simulations and other functions; a library domain 53 in which graphic information for the logical circuit, the structure of internal elements, delay information and the like are registered; the external memory 52 that contains a temporary domain 54 in which each step output is stored; and a display 55 and a keyboard 56 connected to the CPU 51. The test pattern creating system 50 is connected to an outside semiconductor inspection system to be able to output an IQ test pattern group created to the inspection system.

Figure 13:
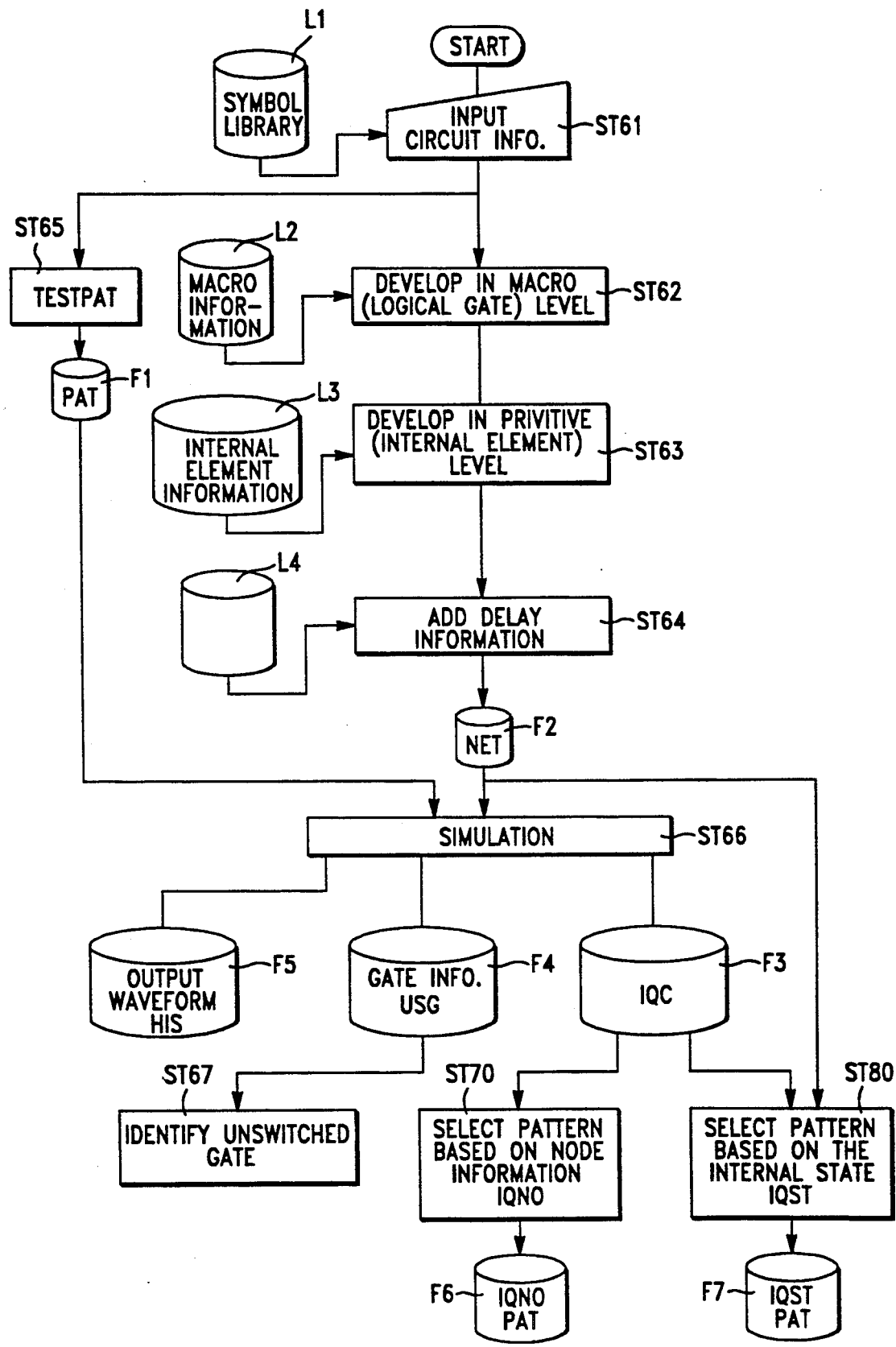
FIG. 13 is a flowchart showing process flows and data in the system for creating test patterns shown in FIG. 12.

FIG. 13 shows process flow for creating the IQ test pattern group in the test pattern creating system 50. A part of the logical circuit simulator is used for the creation system in this example. The content of each step in the figure is explained below:

Step ST61: Symbols provided with necessary functions are selected from a symbol library L1, which is an interactive circuit information registering system, and which is registered in a library of the external memory 52, to register on a screen. In the system of this example, a technique for hierarchically designing the logical circuit is adopted, and the logical circuit can be registered by connecting buses, shift registers, or user-defined logical symbols and the like.

Step ST62: The symbols that represent the structure of the logical circuit registered in Step ST61 are developed in a soft-macro of a macro information library L2. In this stage, the logical symbols are developed based on logical gate structures like flip-flop, NAND, and the like.

Step ST63: The logical circuit developed in the soft-macro in Step ST62 is developed in a hard-macro actually arranged in the semiconductor device based on an internal element information library L3. The hard-macros are limited elements like NAND, NOR, inverter, and the like, and simulations are carried out in units of those elements. The state of those elements are limited and simulation can be executed without developing a transistor level structure of each element.

Step ST64: Delay for internal elements and delays between each element are retrieved from a delay information library L4, a model used for simulation is prepared and output to a delay file (NET) F2 created in the temporary domain 54 of the memory.

Step ST65: On the other hand, the test pattern used for simulation is manually registered or automatically generated based on the logical circuit information registered in Step ST61 and output to a pattern file (PAT) F1 created in the temporary domain 54.

Step ST66: The test pattern output to the pattern file F1 is applied to the simulation model output to the delay file F2 to carry out logical simulation. Then, the states of all nodes in each event applied to the test pattern is output to a node state memory file (IQC) F3 of the temporary domain 54. At the same time, the states of each developed logical gate being driven by the test pattern is output to a gate information file (USG) F4 of the temporary domain 54, and an output waveform of the model in each test pattern is output to an output waveform file (HIS) F5.

Step ST67: When there is a logical gate not being driven by the test pattern in the pattern file F1 based on the gate information file F4, a test pattern is added and changed.

Step ST70: The node state memory file F3 is retrieved, as described later, to select a test pattern that allows efficient measurement of IQ and output to a node control pattern file F6 of the temporary domain 54.

Step ST80: A file for retrieving a specific state of the internal elements is prepared, as described later, from the node state memory file F3 and the delay file F2. Then a test pattern is selected by retrieving the file based on the specific state of the internal elements, and is output to a transistor control pattern file F7 of the temporary domain 54.

System for Creating Test Patterns based on Node State

Another test pattern creating system that retrieves a test pattern that creates a state in which IQ is measured, observing the state of nodes, i.e. 0 or 1 of the node of internal elements that compose a semiconductor device, and that provides output is explained below. The inspection carried out by the test pattern output in this system is an inspection for observing degenerate fault of a semiconductor device as described before.

Figure 14:
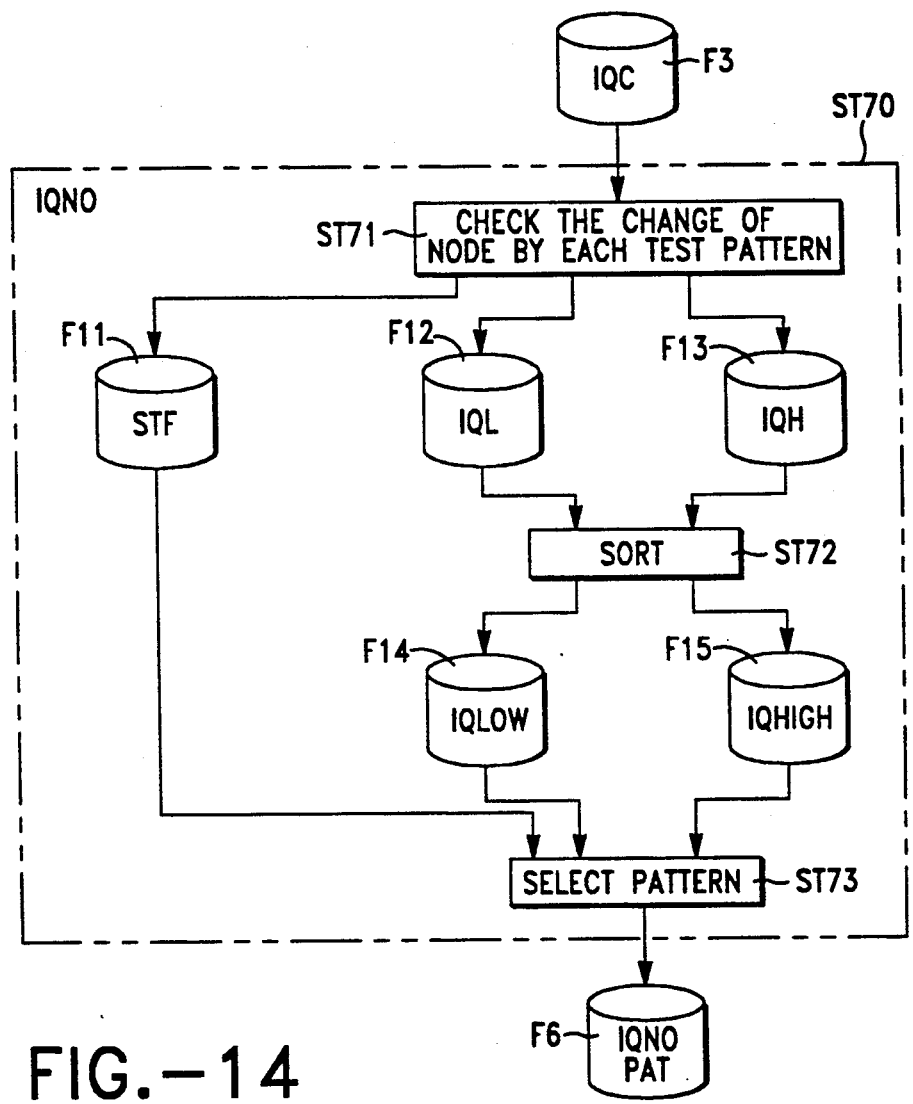
FIG. 14 is a flowchart showing process flow for outputting test patterns based on node states.

FIG. 14 shows a process flow for this system. Each step is explained below.

Step ST71: The node state memory file F3, which is the simulation output, is retrieved to extract the number of nodes whose state is changed in each and every event, that is, events which become 0 at each node and events which become 1 at each node. When node states become 0 or 1, they are the observable states wherein a degenerate fault can be detected. Accordingly, processing is carried out by observing the 0 or 1 state of a node.

In the node state memory file F3, number of nodes whose state is changed in each event, and the state changed are output as a part of file output as shown in FIG. 15. From the state of those nodes, the number of nodes whose state becomes 0 and the number of those whose state becomes 1 in every event are output to a frequency file (STF) F11. A part of the file output of the frequency F11 is shown in FIG. 16.

Then, events in which the state of each node becomes 0 are retrieved from the node state memory file F3, and the event numbers and the number of events are output to a 0-state file (IQL) F12 for each and every node. In the same manner, events in which the state of each node becomes 1 are retrieved and event numbers and the corresponding number of events are output to a 1-state file (IQH) F13 for each node. A part of the file outputs of the 0-state file F12 and the 1-state file F13 are shown in FIGS. 17 and 18, respectively.

Step ST72: The 0-state file F12 and the 1-state file F13 output in Step ST71 are sorted using the number of events as a key. This facilitates retrieval of the nodes whose state is changed less by the test pattern applied in simulation. The sorted 0-state file F12 is output to the 0-state sorted file (IQLOW) F14 and the sorted 1-state file F13 is output to the 1-state sorted file (IQHIGH) F15. A part of each file output is shown in FIGS. 19 and 20.

As seen in FIGS. 19 and 20, sorting the result by the number of events facilitates retrieval of a minimum required test pattern for turning the state of the nodes into 0 or 1. Looking at test patterns that set the node states to 0, the node No. 6 is set to the 0 state only in the event of test pattern No. 4, so that IQ needs to be measured by the test pattern No. 4. That is, node No. 6 is the node that is least likely to turn into an observable state, and the test pattern that controls and turns this node into an observable state is the test pattern No. 4.

Step ST73: A minimum number of required test patterns for turning the state of each node into 0 and 1 is selected from the sorted 0-state file F14 and the 1-state file F15 patterns, that can control and turn the state of nodes having low frequency into observable states, to create an an IQ test pattern group.

Figure 21:
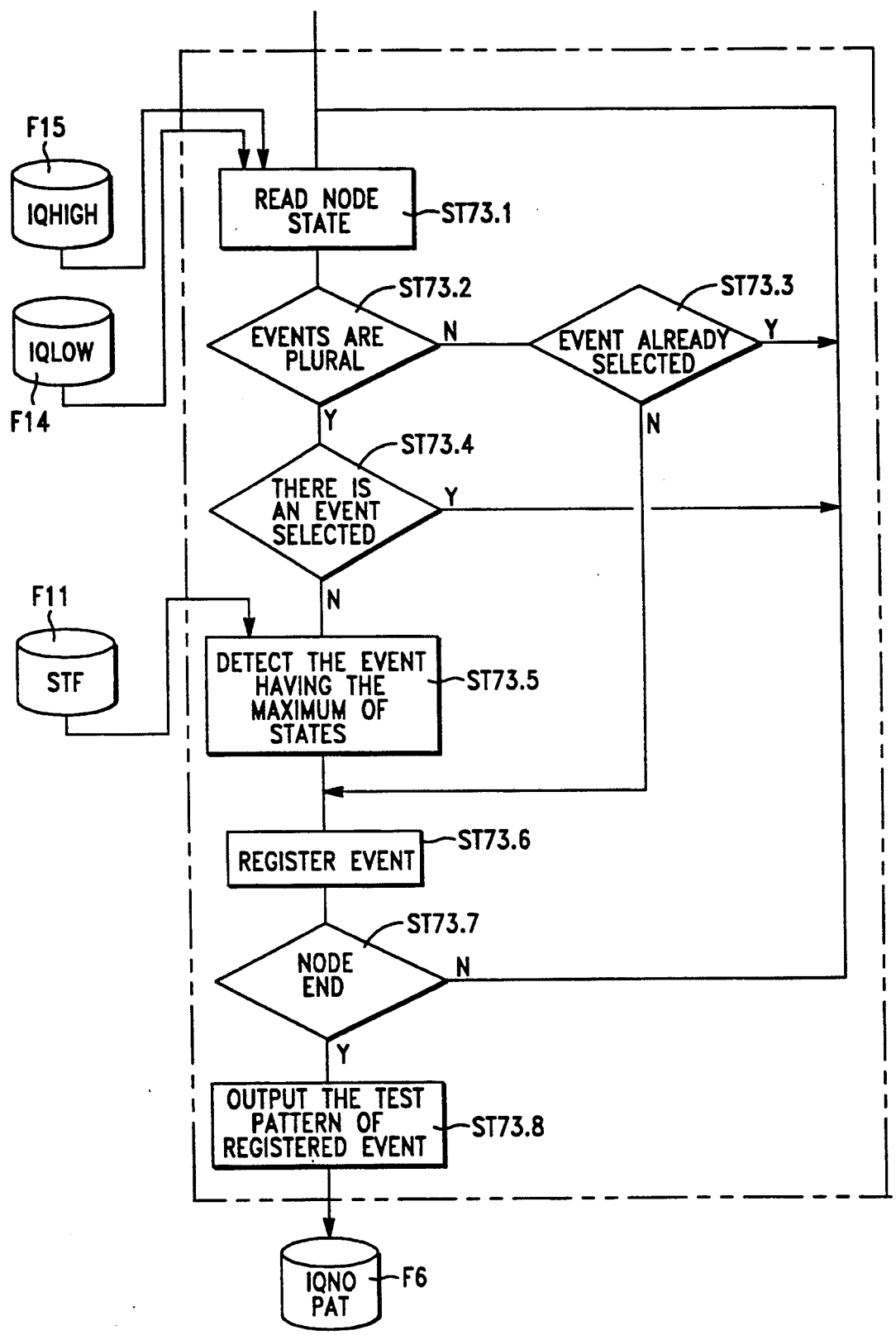
FIG. 21 is a flowchart showing detail process flow for the pattern selecting step ST73 shown in FIG. 14.

FIG. 21 shows a detailed flowchart for this process step. First, data is read from those nodes having a lower number of events listed in the 0-state file F14 or 1-state file F15 (ST73.1). For example, the node state is read from the top of the F15 file shown in FIG. 20, here.

Whether a plurality of events are listed in then determined (ST73.2). If there is one event, the state of that node can be realized only for that event, so that event is registered in Step ST73.1. However, if this is a previously selected event, it is not registered and the next node state is read (ST73.3). That is, in the 1-state file F15 in FIG. 20, the event No. 5 is registered and processing continues until node No. 31 is finished.

If a plurality of events are listed for a node, they are retrieved whether an already registered event exists or not among those events, and if there is an already registered event, the process returns to read the next node state (ST73.4). This is because the state of the node can be realized in the registered event.

When no registered event is found among the listed events, the frequency file F11 is referred to and an event having a maximum number of nodes that can realize a state by that event is selected (ST73.5). It is because the number of states of nodes that can be realized at the same time can be maximized by selecting the event having the maximum number of nodes whose states change, that the number of events to be selected can be reduced. In the 1-state file F15 shown in FIG. 20, the events that turn the node No. 13 into a 1 state are Nos. 10 and 11. Referring now to the frequency file shown in FIG. 16, the number of nodes of state realizable is a total of 29 in event No. 10 and total of 25 in event No. 11. Accordingly, event No. 10 is selected.

Such an operation is carried out for all of the nodes in the file (ST73.7). Therefore, the events in which the state of each node is realized are registered as shown in Table 3, and the test pattern group that realized those events is output to the node control pattern file (IQNO, PAT) F6 (ST73.8).

TABLE 3

| Event No. |   |   |    |     |
|-----------|---|---|----|-----|
| 4         | 5 | 7 | 10 | ... |

An IQ test pattern group minimum required for turning each node into 0 and 1 can be selected by the aforementioned procedure. Accordingly, when there is a fault in the semiconductor device, the internal elements can be controlled and turned into observable states by applying the test pattern group to the semiconductor device. The quality of the semiconductor device can, thereby, be judged by measuring IQ of the semiconductor device to which each test pattern is applied.

Besides the method for retrieving events in which nodes having low frequency to turn into observable state are controlled and turned into observable states as described above, there is another method that notes that each node is in an observable state of 0 or 1 in any of the events, and retrieves events which are in observable states other than the state of node in that event. That is, it is possible to select any event, eliminate observable states of the nodes in the event from other events and select events from ones having more numbers of observable states of the node from the events left. Then, an IQ test pattern group that effectively allows measurement of IQ may be created by the test patterns that correspond to the event.

System for Creating Test Patterns based on Internal Element Transistor Off-leak

A system for creating test patterns to look for a specific state in which the static current IQ flows when there is an off-leak in transistors within internal elements, as described based on Table 2, is explained below.

Figure 22:
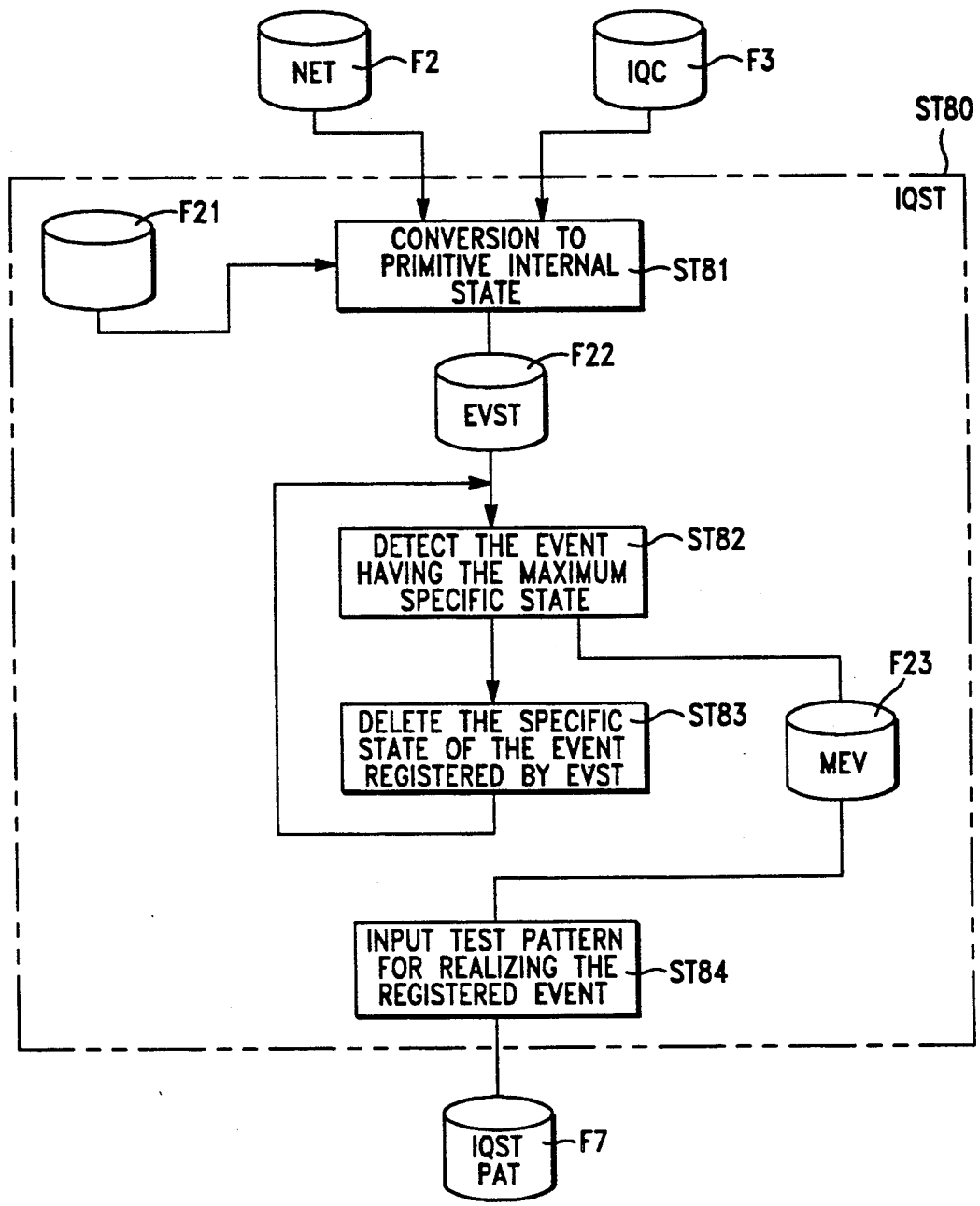
FIG. 22 is a flowchart showing process flow for outputting test patterns based on specific states of primitives shown in FIG. 13.

This system is a system that forms Step ST80 described in reference to FIG. 13 and the process flow of the system is shown in FIG. 22. The content of each step is explained below.

Step ST81: The state of each primitive (internal element) in each event is determined from the node state memory file F3 and the delay file F2 in which simulation models are stored based on the internal state information library F21, and in any specific state in which the off-leak can be detected, the specific states are listed and output to a primitive internal state file (EVST) F22 for each and every event. When there is an off-leak, the observable states in which this can be detected are several specific states which are formed from an ON and OFF combination of the transistors as shown in Table 2.

Figures 23, 26:
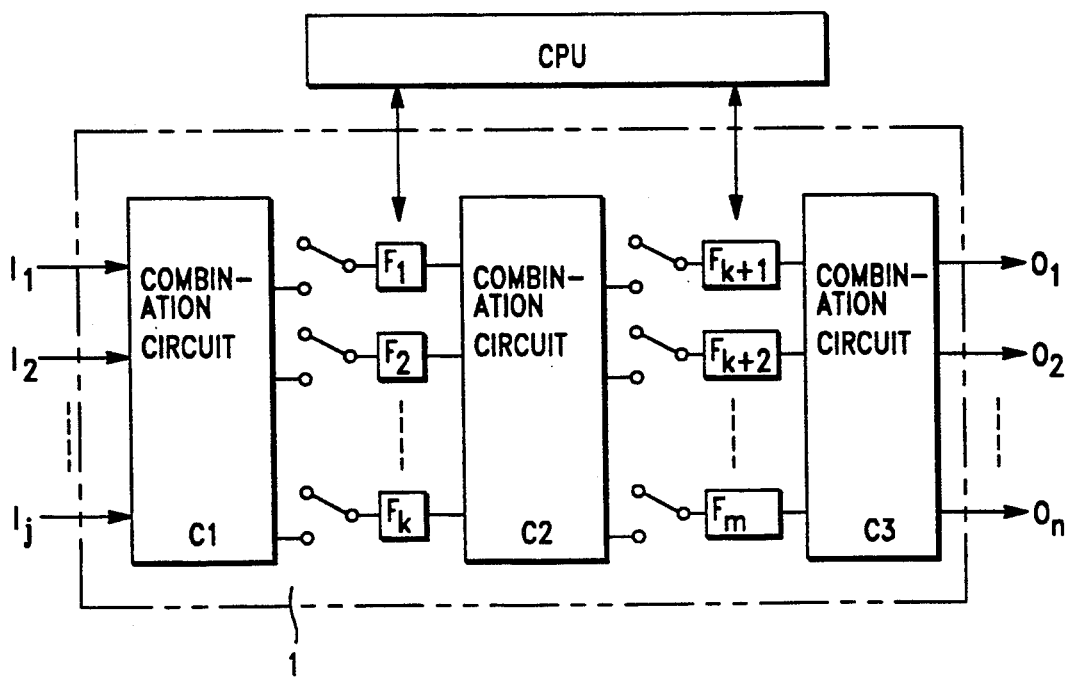
FIG. 23 is an explanatory drawing showing a part of the file output of an internal state information library.
FIG. 26 is an explanatory drawing showing an outline of a scanpass method which is one example of conventional inspection methods.

Primitive types like 2-input NAND (NA2) and 2-input NOR (NO2), which are recognized as the minimum unit in simulation models, a part of whose output is shown in FIG. 23, and the specific states that correspond to each type of node state as shown in Table 2, are stored in the internal state information library F21. Accordingly, the use of library F21 enables specification of the states of primitives in each event from the delay file F2 which is a simulation model and from the node state memory file F3 in which the state of each node in each event is stored, as shown in FIG. 24.

FIG. 24 shows a part of the file output of a primitive internal state file (EVST) F22. In the file F22, event Nos., the number of primitives which are in a specific observable state in the event, and the specific state of each primitive in alphabet are output in the order of primitives. When the state of the primitive is not suitable for detecting the off-leak of the transistors that comprise the primitive, i.e. not an observable state, the state is not output and a blank is left.

Step ST82: An event in which the number of primitives which are in an observable state is maximum, is retrieved from the primitive internal state file F22 outputted in Step ST81. Then the event is output to a maximum event file (MEV) F23, a part of whose file output is shown in FIG. 25. In inspecting using IQ, even if off-leaks occur in a plurality of primitives at the same time, the off-leaks can be detected as they occur by detecting IQ. Due to this, inspection can be carried out effectively by measuring IQ in events in which as many primitives as possible are controlled and turned into observable states.

Step ST83: The observable state of the primitives controlled by the events retrieved in Step ST82 is erased from the specific states listed in the events left. Then the process returns to Step ST82 to retrieve an event in which the number of observable states of the primitives left without having been erased is largest among the remaining events. Thus, events in which each primitive is controlled and turned into each observable state are selected.

For example, among events shown in FIG. 24, when event No. 902 shown in FIG. 25 is selected, in the event No. 1015, the observable states in the primitives left are as shown in Table 4 below.

TABLE 4

| Event No. | Number of Specific State | Specific State for Every Primitive |
|-----------|--------------------------|------------------------------------|
| 1015      | 0699                     | BBBC DB A AB DAAD DCCCCCB A CE... |
| \|        |                          |                                    |
| 1015      | 0072                     | B B D C...                         |

As shown in Table 4, after selecting events in which the number of observable states is maximum, the observable states related to the selected events are erased from the events left and events in which the number of observable states left is maximum are selected in order.

Step ST84: An off-leak can be effectively detected by measuring IQ for the events selected in Step ST83. Accordingly, inspection using the test pattern group that controls the selected events as IQ test pattern groups is effective. The test pattern group that corresponds to these events is output to the transistor control pattern file (IQST. PAT).

The system for creating test patterns that operates in accordance with the aforementioned procedure allows creation of the IQ test pattern group that allows effective detection of faults accompanying off-leaks. Although the output test pattern group presenting events having numbers of internal elements controlled and turned into observable states in this example, the system may be one that retrieves minimum events required for realizing the observable state detecting the observable state of each primitive and outputs the test pattern group related to the events. Similarly, it may be a system for creating test patterns looking at node states as described before. That is, events controlled and turned into observable states are retrieved for every observable state of the primitives from the primitive internal state file F22 shown in FIG. 22. The IQ test pattern group may be created by selecting primitives having less frequency to turn into observable states from the test patterns that can control and turn into the observable states from the retrieval result. The use of the IQ test pattern group allows effective inspection.

The structure of the systems for creating test patterns noticing on node states and on off-leaks may be same as the system previously explained in relation to FIG. 12. Moreover, systems for creating test patterns may be realized using CPU 26 and memory 27 of the inspecting system explained in relation to FIG. 7.

Furthermore, the above description has been made for an inspection procedure in which no restriction needed to be added to node states. That is, when the semiconductor device or a circuit within the semiconductor device to be inspected entirely comprises complementary MISFETs like CMOS, normal current does not flow in a state in which the internal elements are stable. Therefore, IQ may be measured even if the node state is either 0 or 1. However, in a device containing a resistor for pull-up or a MOS, IQ cannot be detected in a state in which current flows in the resistor and others, since normal current flows in the power circuit. Therefore, IQ has to be measured in a state in which no current flows in the pull-up resistor or MOS during inspection of such a device. Such a state may be extracted by retrieving events in which a specific node is 0 or 1 from the node state memory file in which the results of simulations are stored. Then it is possible to create a test pattern group suitable for inspection using IQ in the systems described above based on the extracted events. It is also possible to determine the quality of those elements based on measured IQ in a state in which no current flows in the pull-up resistor or the MOS. Thus, by adding several restrictions in retrieving the node state, or the internal state of the primitives, in the test pattern creating systems, the inspection method and system based on the measurement of IQ described above may be used for inspection of not only complementary semiconductor devices but also various other semiconductor devices.

Although the system for selecting an IQ test pattern group from registered test pattern groups or automatically generated test pattern groups have been explained above, the system may be one that creates the IQ test pattern group from test patterns generated by input values which have been adjusted so that a certain node state or a certain internal state of primitives is turned into an observable state. This system requires no observation of faults at the output side, differing from the conventional system for creating test patterns, so that it aims at generating test patterns that can control and turn the node state, or the internal state of the primitives, into observable states, not test patterns that mainly aim at propagating faults. Because of this, the time necessary for generating the test pattern group may be shortened. Then, inspection based on the static current using this test pattern group allows the same functional inspection as in the past, and at the same time, allows effective inspection of faults that involve long range reliability. As a matter of course, an IQ test pattern group having further improved inspection efficiency may be created by retrieving and selecting test patterns more suited for the measurement of IQ, as described above, based on the test pattern groups which are created by the above systems for creating test patterns, an whose input values are adjusted.

Accordingly, the inspection method and system of the present invention based on the measurement of the static current IQ, may be used for periodic inspection and fault diagnosis of semiconductor devices and complementary semiconductor devices in particular. Moreover, they can also be used for inspecting products during the production process for semiconductor devices. Furthermore, the inspection method and system of the present invention, based on static current, allow effective detection not only of functional faults in the semiconductor device, but also defects involving long range reliability, so that they are well suited for inspection used for producing devices which require high reliability. Then, systems for creating test patterns for inspection are useful for facilitating test designing of semiconductor devices.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A method for inspecting a semiconductor device having at least one functional cell including a plurality of internal elements, said method comprising the steps of:

applying patterns from a static current inspecting pattern group to the semiconductor device, so as to control and turn each of said internal elements into an observable state in which a static current flows in said functional cell in response to at least one fault in said functional cell, said static current inspecting pattern group including patterns suitable for measuring static current;

measuring static current after applying said patterns; and comparing said measured static current with a predetermined value to determine whether the semiconductor device is defective.

2. The method for inspecting a semiconductor device according to claim 1, wherein said static current inspecting pattern group comprises an input value adjusted pattern group whose input values are adjusted based on circuit information for said functional cell so that at least one internal element is controlled and turned into an observable state.

3. The method for inspecting a semiconductor device according to claim 1, wherein said static current inspecting pattern group comprises a retrieved pattern group which is extracted from patterns included in a larger group of inspecting patterns, said retrieved pattern group including patterns that can control and turn at least one internal element into an observable state.

4. The method for inspecting a semiconductor device according to claim 1, wherein said static current inspecting pattern group comprises a first optimized inspecting pattern group which is extracted from patterns that can control and turn at least one internal element into an observable state, said first optimized inspecting pattern group including patterns that can control and turn specific internal elements into observable states, with said specific internal elements being least likely to be turned into observable states.

5. The method for inspecting a semiconductor device according to claim 1, wherein said static current inspecting pattern group comprises a second optimized inspecting pattern group which is extracted from patterns that can control and turn at least one internal element into an observable state, said second optimized inspecting pattern group including patterns that can control and turn a larger number of internal elements into observable states.

6. The method for inspecting a semiconductor device according to claim 5, wherein said functional cell further includes nodes for interconnecting said internal elements, and wherein said static current inspecting pattern group further comprises a node control pattern group that includes patterns that can control and turn said nodes into observable states for controlling and turning said internal elements into observable states.

7. The method for inspecting a semiconductor device according to claim 6, wherein said internal elements comprises transistors and said static current inspecting pattern group further comprises a transistor control pattern group that includes patterns that can control and turn said transistors into observable states by controlling specific ON and OFF states for said transistors.

8. The method of claim 7, wherein said transistors comprises MISFETs.

9. The method of claim 1, wherein said functional cell further includes nodes for interconnecting said internal elements, and wherein said static current inspecting pattern group further comprises a node control pattern group that includes patterns that can control and turn said nodes into observable states for controlling and turning said internal elements into observable states.

10. The method of claim 1, wherein said internal elements comprises transistors and said static current inspecting pattern group further comprises a transistor control pattern group that includes patterns that can control and turn said transistors into observable states by controlling specific ON and OFF states for said transistors.

11. The method for inspecting a semiconductor device according to claim 10, wherein said transistor control pattern group comprises a first optimized inspecting pattern group which is extracted from patterns that can control and turn at least one transistor into an observable state, said first optimized inspecting pattern group including patterns that can control and turn specific transistors into observable states, with said specific transistors being least likely to be turned into observable states.

12. The method for inspecting a semiconductor device according to claim 11, wherein said transistor control pattern group further comprises a second optimized inspecting pattern group which is extracted from the patterns that can control and turn at least one transistor into an observable state, said second optimized inspecting pattern group including patterns that can control and turn a larger number of transistors into observable states, so that a minimum number of patterns are extracted and included in said transistor control pattern group.

13. The method for inspecting a semiconductor device according to claim 10, wherein said node control pattern group comprises a second optimized inspecting pattern group which is extracted from patterns that can control and turn at least one transistor into an observable state, said second optimized inspecting pattern group including patterns that can control and turn a larger number of transistors into observable states.

14. The method for inspecting a semiconductor device according to claim 9, wherein said node control pattern group comprises a first optimized inspecting pattern group which is extracted from patterns that can control and turn at least one node into an observable state, said first optimized inspecting pattern group including patterns that can control and turn specific nodes into observable states, with said specific nodes being least likely to be turned into observable states.

15. The method for inspecting a semiconductor device according to claim 14, wherein said node control pattern group further comprises a second optimized inspecting pattern group which is extracted from the patterns that can control and turn at least one node into an observable state, said second optimized inspecting pattern group including patterns that can control and turn a larger number of nodes into observable states, so that a minimum number of patterns are extracted and included in said node control pattern group.

16. The method for inspecting a semiconductor device according to claim 9, wherein said node control pattern group comprises a second optimized inspecting pattern group which is extracted from patterns that can control and turn at least one node into an observable state, said second optimized inspecting pattern group including patterns that can control and turn a larger number of nodes into observable states.

17. The method for inspecting a semiconductor device according to claim 4, wherein said static current inspecting pattern group further comprises a second optimized inspecting pattern group which is extracted from the patterns that can control and turn at least one internal element into an observable state, said second optimized inspecting pattern group including patterns that can control and turn a larger number of internal elements into observable states, so that a minimum number of patterns are extracted and included in said static current inspecting pattern group.

18. The method for inspecting a semiconductor device according to claim 6, wherein said node control pattern group comprises a first optimized inspecting pattern group which is extracted from patterns that can control and turn at least one node into an observable state, said first optimized inspecting pattern group including patterns that can control and turn specific nodes into observable states, with said specific nodes being least likely to be turned into observable states.

19. The method for inspecting a semiconductor device according to claim 18, wherein said node control pattern group further comprises a second optimized inspecting pattern group which is extracted from the patterns that can control and turn at least one node into an observable state, said second optimized inspecting pattern group including patterns that can control and turn a larger number of nodes into observable states, so that a minimum number of patterns are extracted and included in said node control pattern group.

20. The method for inspecting a semiconductor device according to claim 6, wherein said node control pattern group comprises a second optimized inspecting pattern group which is extracted from patterns that can control and turn at least one node into an observable state, said second optimized inspecting pattern group including patterns that can control and turn a larger number of nodes into observable states.

21. The method for inspecting a semiconductor device according to claim 7, wherein said transistor control pattern group comprises a first optimized inspecting pattern group which is extracted from patterns that can control and turn at least one transistor into an observable state, said first optimized inspecting pattern group including patterns that can control and turn specific transistors into observable states, with said specific transistors being least likely to be turned into observable states.

22. The method for inspecting a semiconductor device according to claim 21, wherein said transistor control pattern group further comprises a second optimized inspecting pattern group which is extracted from the patterns that can control and turn at least one transistor into an observable state, said second optimized inspecting pattern group including patterns that can control and turn a larger number of transistors into observable states, so that a minimum number of patterns are extracted and included in said transistor control pattern group.

23. The method for inspecting a semiconductor device according to claim 7, wherein said node control pattern group comprises a second optimized inspecting pattern group which is extracted from patterns that can control and turn at least one transistor into an observable state, said second optimized inspecting pattern group including patterns that can control and turn a larger number of transistors into observable states.

* * * * *

UNITED STATES PATENT AND TRADEMARK OFFICE
CERTIFICATE OF CORRECTION

PATENT NO.  : 5,321,354
DATED       : June 14, 1994
INVENTOR(S) : Ooshima et al.

It is certified that error appears in the above-identified patent and that said Letters Patent is hereby corrected as shown below:

In the Abstract,   line 3, after "fixed", change "," to --.--.

line 3, after "fixed", change "the" to --The--.

In the drawings, Sheet 4, Fig. 8, at element 39, add --1/T--.

Sheet 5, Fig. 10, at step ST34, change "=" to --≠--.

Sheet 6, Fig. 11, change "ST43" (second occurrence) to --ST44--.

Sheet 7, Fig. 13, at element 14, add --DELAY INFORMATION--.

Sheet 13, Fig. 21, outside the outline, add --ST73--.

Sheet 14, Fig. 22, at element F21, add --INTERNAL STATE

INFORMATION--.

Signed and Sealed this

Second Day of May, 1995

Attest:

BRUCE LEHMAN

*Attesting Officer*          *Commissioner of Patents and Trademarks*